US 11,488,956 B2

(12) United States Patent
Hwang et al.

(10) Patent No.: US 11,488,956 B2
(45) Date of Patent: Nov. 1, 2022

(54) SEMICONDUCTOR MEMORY DEVICE

(71) Applicant: SAMSUNG ELECTRONICS CO., LTD., Suwon-si (KR)

(72) Inventors: Beomyong Hwang, Seoul (KR); Min Hee Cho, Suwon-si (KR); Hei Seung Kim, Suwon-si (KR); Mirco Cantoro, Hwaseong-si (KR); Hyunmog Park, Seoul (KR); Woo Bin Song, Hwaseong-si (KR); Sang Woo Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/313,570

(22) Filed: May 6, 2021

(65) Prior Publication Data

US 2021/0257369 A1    Aug. 19, 2021

Related U.S. Application Data

(63) Continuation of application No. 16/442,769, filed on Jun. 17, 2019, now Pat. No. 11,018,137.

(30) Foreign Application Priority Data

Nov. 2, 2018 (KR) .................. 10-2018-0133421

(51) Int. Cl.
*H01L 27/10* (2006.01)
*H01L 27/108* (2006.01)
*G11C 11/402* (2006.01)

(52) U.S. Cl.
CPC .... *H01L 27/10805* (2013.01); *G11C 11/4023* (2013.01)

(58) Field of Classification Search
CPC ............ H01L 27/10805; H01L 27/088; H01L 27/0688; G11C 11/4023
(Continued)

(56) References Cited

U.S. PATENT DOCUMENTS 8,378,499 B2    2/2013 Hasunuma
9,331,071 B2    5/2016 Sunamura et al.
(Continued)

OTHER PUBLICATIONS

Cheng et al., "A Logic-compatible Embedded DRAM Utilizing Common-body Toggled Capacitive Cross-talk", Journal of Semiconductor Technology and Science, vol. 16, No. 6, Dec. 2016, pp. 781-792, 13 pages total.

*Primary Examiner* — Didarul A Mazumder
(74) *Attorney, Agent, or Firm* — Sughrue Mion, PLLC

(57) ABSTRACT

A semiconductor device includes a substrate, a peripheral circuit layer, a first active pattern, a gate electrode, a first insulating layer, a conductive contact, and a second active pattern. The peripheral circuit layer is disposed on the substrate, and the peripheral circuit layer includes logic transistors and an interconnection layer that is disposed on the logic transistors. The first active pattern is disposed on the peripheral circuit layer. The gate electrode is disposed on a channel region of the first active pattern. The first insulating layer is disposed on the first active pattern and the gate electrode. The conductive contact is disposed in the first insulating layer and is electrically connected to a first source/drain region of the first active pattern, and the second active pattern is disposed on the first insulating layer. The channel region of the second active pattern vertically overlaps with the conductive contact.

20 Claims, 22 Drawing Sheets

(58) Field of Classification Search
USPC .................. 257/296; 438/238, 239, 386, 399
See application file for complete search history.

(56) References Cited

U.S. PATENT DOCUMENTS

| | | | |
|---|---|---|---|
| 9,806,082 B2 | 10/2017 | Tanaka et al. | |
| 9,990,997 B2 | 6/2018 | Matsuzaki et al. | |
| 10,032,777 B1 | 7/2018 | Chen et al. | |
| 2008/0111198 A1* | 5/2008 | Jang | H01L 27/0688 257/E27.06 |
| 2009/0250735 A1* | 10/2009 | Asao | H01L 27/24 257/295 |
| 2010/0213458 A1* | 8/2010 | Prall | H01L 29/66825 257/43 |
| 2010/0221889 A1* | 9/2010 | Youn | H01L 27/10894 257/E21.011 |
| 2015/0255490 A1* | 9/2015 | Miyairi | H01L 27/1207 257/43 |
| 2016/0049406 A1 | 2/2016 | Sandhu | |
| 2017/0154909 A1 | 6/2017 | Ishizu | |
| 2018/0083049 A1 | 3/2018 | Sakata et al. | |

\* cited by examiner

SEMICONDUCTOR MEMORY DEVICE

CROSS-REFERENCE TO RELATED APPLICATION

This is a continuation of U.S. application Ser. No. 16/442,769, filed Jun. 17, 2019, which claims priority under 35 U.S.C. § 119 from Korean Patent Application No. 10-2018-0133421, filed on Nov. 2, 2018, in the Korean Intellectual Property Office, the disclosures of each of which are hereby incorporated by reference in their entireties.

BACKGROUND

1. Field

Embodiments relate to a semiconductor device and, more particularly, to a semiconductor memory device with improved integration density.

2. Description of the Related Art

Semiconductor devices are widely used in an electronic industry because of their small sizes, multi-functional characteristics, and/or low manufacture costs. Data storage devices among the semiconductor devices may store logical data. The data storage devices have been highly integrated with the development of the electronic industry. Thus, widths of elements or components of the data storage devices have been reduced.

In addition, high reliability of the data storage devices is required with the high integration of the data storage devices. However, the reliability of the data storage devices may be deteriorated by the high integration. Thus, various researches have been carried out to improve the reliability of the data storage devices.

SUMMARY

It is an aspect to provide a semiconductor memory device with improved integration density.

According to an aspect of one or more embodiments, there is provided a semiconductor memory device comprising a substrate, a first active pattern on the substrate, a gate electrode intersecting a channel region of the first active pattern, a first insulating layer covering the first active pattern and the gate electrode, a contact penetrating the first insulating layer so as to be electrically connected to a first source/drain region of the first active pattern, and a second active pattern on the first insulating layer. A channel region of the second active pattern may vertically overlap with the contact.

According to an aspect of one or more embodiments, there is provided a semiconductor memory device comprising a substrate, a first active pattern on the substrate, a first device isolation layer covering a sidewall of the first active pattern, a gate electrode and a capacitor electrode provided on the first active pattern and the first device isolation layer, respectively, an insulating layer covering the first active pattern, the gate electrode, and the capacitor electrode, a contact penetrating the insulating layer so as to be electrically connected to the first active pattern, the contact provided between the gate electrode and the capacitor electrode, and a second active pattern on the contact.

According to an aspect of one or more embodiments, there is provided a semiconductor memory device comprising a substrate, a first transistor on the substrate, a first word line connected to a gate of the first transistor, a first bit line connected to a first source/drain of the first transistor, a second transistor vertically stacked on the first transistor, a storage node vertically connecting a second source/drain of the first transistor and a gate of the second transistor, a second bit line connected to a first source/drain of the second transistor, and a second word line connected to a second source/drain of the second transistor.

BRIEF DESCRIPTION OF THE DRAWINGS

Various embodiments will become more apparent in view of the attached drawings and accompanying detailed description, in which.

DETAILED DESCRIPTION

Figure 1:
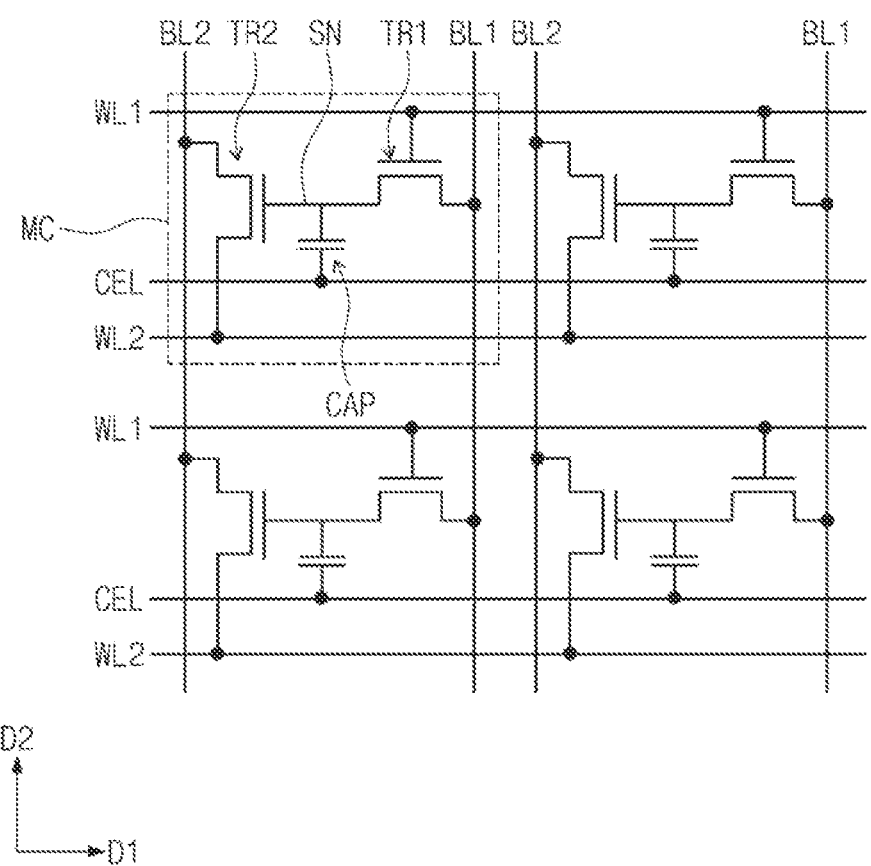
FIG. 1 is a schematic circuit diagram illustrating a cell array of a semiconductor memory device according to some embodiments.

FIG. 1 is a schematic circuit diagram illustrating a cell array of a semiconductor memory device according to some embodiments.

Referring to FIG. 1, a cell array according to some embodiments may include first bit lines BL1, second bit lines BL2, first word lines WL1, second word lines WL2, capacitor electrode lines CEL, and memory cells MC. The first and second bit lines BL1 and BL2 may extend in a second direction D2. The first and second word lines WL1 and WL2 and the capacitor electrode lines CEL may extend in a first direction D1.

One memory cell MC may be disposed between the first word line WL1 and the second word line WL2 and between the first bit line BL1 and the second bit line BL2. Each of the memory cells MC may include a first transistor TR1, a second transistor TR2, and a capacitor CAP. The first transistor TR1 may be a writing transistor, and the second transistor TR2 may be a reading transistor. In other words, the memory cell MC according to the embodiment shown in FIG. 1 may be a 2-transistor-1-capacitor dynamic random access memory (2T1C DRAM) cell having two transistors and one capacitor. It is noted that four memory cells are shown in FIG. 1, but this is only for easy of illustration, and cell array may include more memory cells MC.

In some embodiments, a source (or drain) of the first transistor TR1 may be connected to the first bit line BL1, and a gate of the first transistor TR1 may be connected to the first word line WL1. A source (or drain) of the second transistor TR2 may be connected to the second bit line BL2, and a drain (or source) of the second transistor TR2 may be connected to the second word line WL2. A drain (or source)

of the first transistor TR1 may be connected to a gate of the second transistor TR2 through a storage node SN. A first electrode of the capacitor CAP may be connected to the storage node SN, and a second electrode of the capacitor CAP may be connected to the capacitor electrode line CEL.

Figure 2:
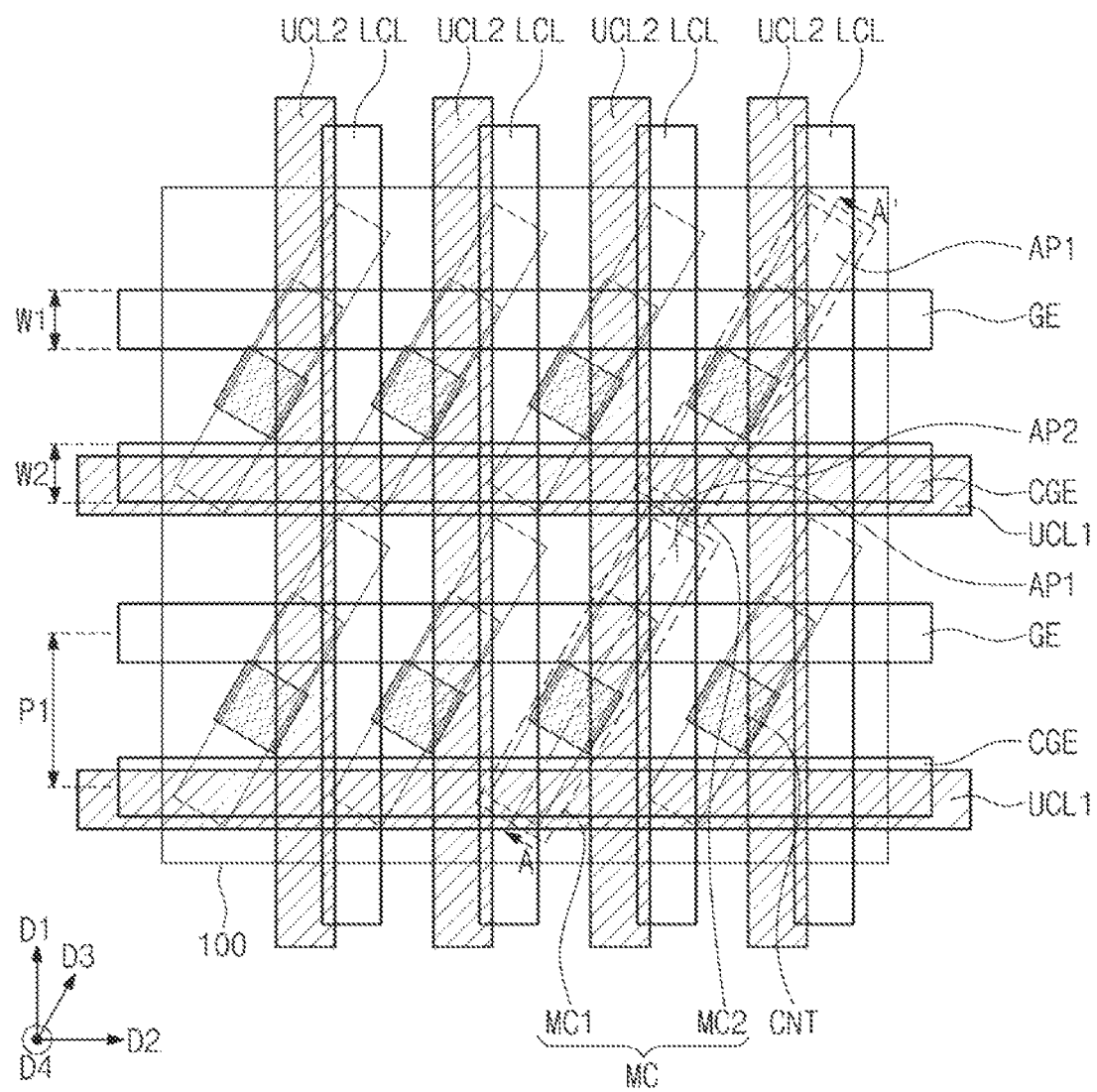
FIG. 2 is a plan view illustrating a semiconductor memory device according to some embodiments.
Figure 3:
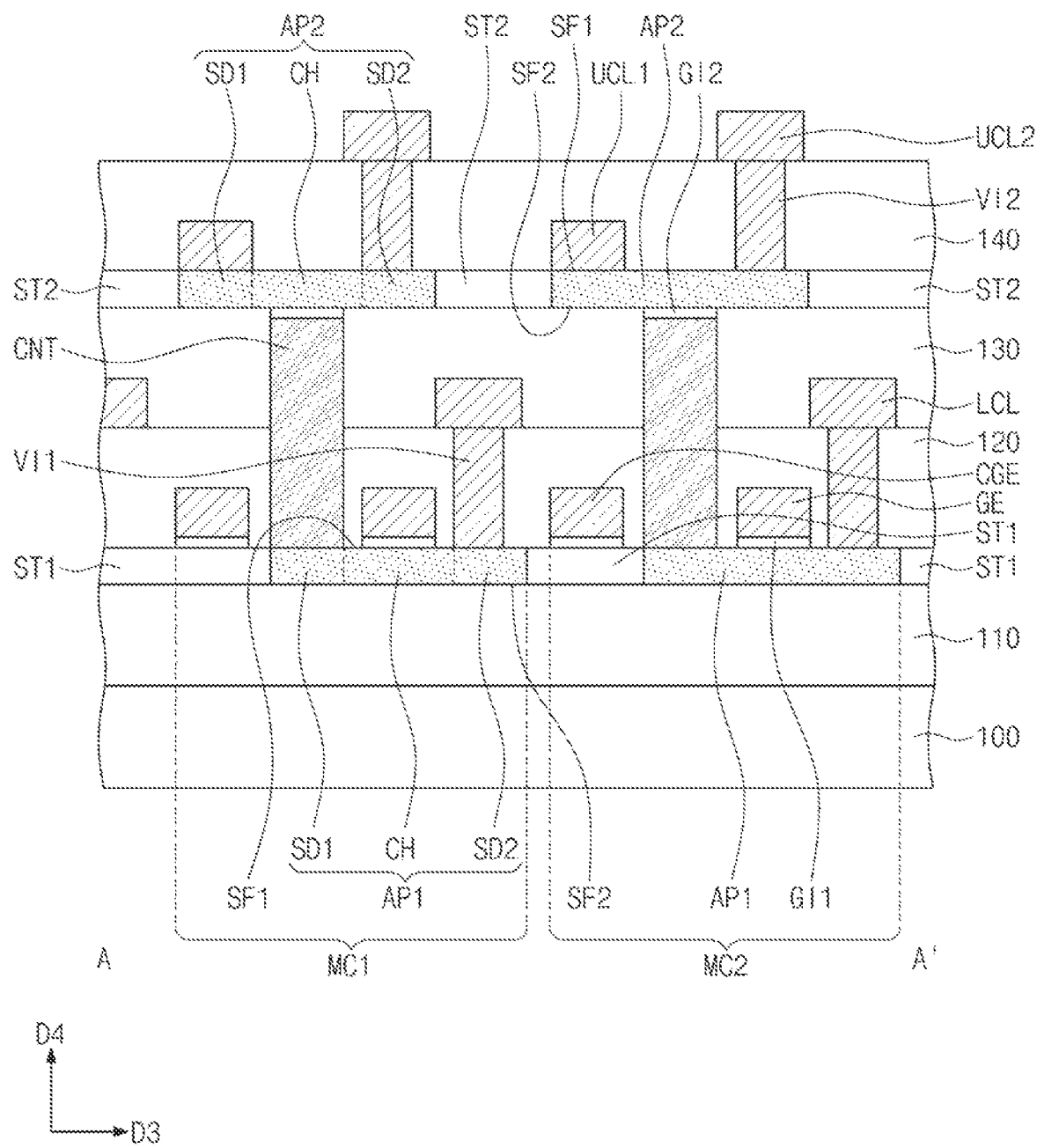
FIG. 3 is a cross-sectional view taken along a line A-A' of FIG. 2.

FIG. 2 is a plan view illustrating a semiconductor memory device according to some embodiments. FIG. 3 is a cross-sectional view taken along a line A-A' of FIG. 2.

Referring to FIGS. 1 to 3, a plurality of memory cells MC may be provided on a substrate 100. The structure of each memory cell MC may be the same. In some embodiments, the substrate 100 may be a silicon substrate, a germanium substrate, or a silicon-germanium substrate. In some embodiments, the memory cells MC may include a first memory cell MC1 and a second memory cell MC2 which are adjacent to each other in a third direction D3. The third direction D3 may intersect all of the first and second directions D1 and D2. The first, second and third directions D1, D2 and D3 may be parallel to a top surface of the substrate 100.

A first insulating layer 110 may be provided on the substrate 100. First active patterns AP1 may be provided on the first insulating layer 110. Each of the first active patterns AP1 may extend in the third direction D3. A long axis of each of the first active patterns AP1 may be parallel to the third direction D3. The first active patterns AP1 may be two-dimensionally arranged in the first direction D1 and the second direction D2. Each of the memory cells MC may include one of the first active patterns AP1. For example, the first active pattern AP1 of the first memory cell MC1 may be spaced apart from the first active pattern AP1 of the second memory cell MC2 in the third direction D3, as shown in FIG. 3.

The first active pattern AP1 may include a first source/drain region SD1, a second source/drain region SD2, and a channel region CH between the first and second source/drain regions SD1 and SD2. The first active pattern AP1 may have a first surface SF1 and a second surface SF2 opposite to the first surface SF1. The second surface SF2 of the first active pattern AP1 may face the substrate 100. The first active pattern AP1 may include an amorphous oxide semiconductor (AOS). The first active pattern AP1 may include a compound of oxygen (O) and at least two metals selected from a group consisting of zinc (Zn), indium (In), gallium (Ga), and tin (Sn). For example, the first active pattern AP1 may include indium gallium zinc oxide (IGZO) or indium tin zinc oxide (ITZO).

A first device isolation layer ST1 may be provided between the first active patterns AP1. The first device isolation layer ST1 may cover a sidewall of each of the first active patterns AP1. The first active patterns AP1 may be spaced apart from the substrate 100 with the first insulating layer 110 interposed therebetween. The first active patterns AP1 may be spaced apart from each other with the first device isolation layer ST1 interposed therebetween. The first surface SF1 of the first active pattern AP1 may be substantially coplanar with a top surface of the first device isolation layer ST1. For example, the first device isolation layer ST1 may include a silicon oxide layer.

In some embodiments, the first insulating layer 110 may directly cover the top surface of the substrate 100. For example, the substrate 100 and the first insulating layer 110 may be a portion of a silicon-on-insulator (SOI) substrate. In certain embodiments, logic transistors and interconnection lines constituting a logic circuit may be formed on the substrate 100 (see FIG. 22 to be described later). The first insulating layer 110 may cover the logic transistors and the interconnection lines. In other words, the memory cells MC according to some embodiments may be disposed on the logic circuit. The memory cells MC may be used as a memory of the logic circuit (i.e., a logic cell).

Gate electrodes GE may be provided on the first surfaces SF1 of the first active patterns AP1. Capacitor electrodes CGE may be provided on the top surface of the first device isolation layer ST1. The gate electrodes GE and the capacitor electrodes CGE may extend in the second direction D2 in parallel to each other, as shown in FIG. 2. The gate electrodes GE and the capacitor electrodes CGE may be alternately arranged in the first direction D1. For example, the capacitor electrode CGE may be disposed between a pair of the gate electrodes GE adjacent to each other. The gate electrode GE may be disposed between a pair of the capacitor electrodes CGE adjacent to each other.

The gate electrode GE may cross over the channel region CH of the first active pattern AP1. A first gate dielectric layer GI1 may be disposed between the gate electrode GE and the first active pattern AP1 and between the gate electrode GE and the first device isolation layer ST1. The first gate dielectric layer GI1 may extend in the second direction D2 along a bottom surface of the gate electrode GE.

For example, the first active pattern AP1 and the gate electrode GE of the first memory cell MC1 may constitute the first transistor TR1 of the memory cell MC described above with reference to FIG. 1. Since the first active pattern AP1 includes the amorphous oxide semiconductor layer, the first transistor TR1 according to some embodiments may be a thin film transistor (TFT). The gate electrode GE may be the first word line WL1 connected to the gate of the first transistor TR1 of FIG. 1.

The capacitor electrode CGE may cross over the first device isolation layer ST1 between the first active patterns AP1. The capacitor electrode CGE may be spaced apart from the first active patterns AP1. In some embodiments, the first gate dielectric layer GI1 may also be disposed between the capacitor electrode CGE and the first device isolation layer ST1. The first gate dielectric layer GI1 may extend in the second direction D2 along a bottom surface of the capacitor electrode CGE. In certain embodiments, the first gate dielectric layer GI1 between the capacitor electrode CGE and the first device isolation layer ST1 may be omitted.

The gate electrode GE may have a first width W1 in the first direction D1, as shown in FIG. 2. The capacitor electrode CGE may have a second width W2 in the first direction D1. The first width W1 may be substantially equal to the second width W2. In some embodiments, the pitch P1 between the gate electrode GE and the capacitor electrode CGE may be constant. For example, the gate electrodes GE and the capacitor electrodes CGE may be alternately arranged in the first direction D1 at the pitch P1.

In some embodiments, the gate electrode GE and the capacitor electrode CGE may include the same conductive material. For example, the conductive material may include at least one of a conductive metal nitride (e.g., titanium nitride or tantalum nitride) or a metal material (e.g., titanium, tantalum, tungsten, copper, or aluminum). The first gate dielectric layer GI1 may include a silicon oxide layer, a silicon nitride layer, a silicon oxynitride layer, and/or a high-k dielectric layer. For example, the high-k dielectric layer may include hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof.

A second insulating layer 120 may be provided on the gate electrodes GE and the capacitor electrodes CGE. Lower conductive lines LCL may be provided on the second insulating layer 120. The lower conductive lines LCL may extend in the first direction D1 in parallel to each other, as shown in FIG. 2. The lower conductive lines LCL may be arranged in the second direction D2. That is, the lower conductive lines LCL may be spaced apart from one another in the second direction D2, as shown in FIG. 2.

First vias VI1 may penetrate the second insulating layer 120 so as to be connected to the second source/drain regions SD2 of the first active patterns AP1, respectively. The lower conductive line LCL may be disposed on the first via VI1 and may be connected to the first via VI1. The lower conductive line LCL may be electrically connected to the second source/drain region SD2 of the first active pattern AP1 through the first via VI1. The lower conductive line LCL may be the first bit line BL1 connected to the source (or drain) of the first transistor TR1 of FIG. 1.

A third insulating layer 130 may be provided on the second insulating layer 120 to cover the lower conductive lines LCL. Contacts CNT may penetrate the third and second insulating layers 130 and 120 so as to be connected to the first source/drain regions SD1 of the first active patterns AP1, respectively. Each of the first vias VI1, the lower conductive lines LCL and the contacts CNT may include a conductive metal nitride and/or a metal material.

The contact CNT may be adjacent to the capacitor electrode CGE, as best seen in FIG. 3. The contact CNT, the capacitor electrode CGE and the second insulating layer 120 disposed therebetween may constitute the capacitor CAP of FIG. 1. The capacitor CAP may be used as a boosting capacitor and may improve an operating speed of the 2T1C DRAM cell according to some embodiments. For example, a ground voltage may be applied to the capacitor electrode CGE.

Second active patterns AP2 may be provided on the third insulating layer 130. Each of the second active patterns AP2 may extend in the third direction D3, as shown in FIG. 2. A long axis of each of the second active patterns AP2 may be parallel to the third direction D3. The second active patterns AP2 may be two-dimensionally arranged in the first direction D1 and the second direction D2. Each of the memory cells MC may include one of the second active patterns AP2. For example, the second active pattern AP2 of the first memory cell MC1 may be spaced apart from the second active pattern AP2 of the second memory cell MC2 in the third direction D3.

The second active pattern AP2 may include a first source/drain region SD1, a second source/drain region SD2, and a channel region CH between the first and second source/drain regions SD1 and SD2. The second active pattern AP2 may have a first surface SF1 and a second surface SF2 opposite to the first surface SF1. The second surface SF2 of the second active pattern AP2 may face the substrate 100. The second active pattern AP2 may include an amorphous oxide semiconductor. For example, the second active pattern AP2 may include indium gallium zinc oxide (IGZO) or indium tin zinc oxide (ITZO).

A second device isolation layer ST2 may be provided between the second active patterns AP2. The second device isolation layer ST2 may cover a sidewall of each of the second active patterns AP2. The second active patterns AP2 may be spaced apart from each other with the second device isolation layer ST2 interposed therebetween. The first surface SF1 of the second active pattern AP2 may be substantially coplanar with a top surface of the second device isolation layer ST2. For example, the second device isolation layer ST2 may include a silicon oxide layer.

The first active pattern AP1 may be offset from the second active pattern AP2 disposed thereon in the third direction D3, as best seen in FIG. 3. The first active pattern AP1 may partially overlap with the second active pattern AP2 thereon when viewed in a plan view. For example, the first active pattern AP1 of the first memory cell MC1 may be offset from the second active pattern AP2 of the first memory cell MC1 in the third direction D3, as shown in FIG. 3.

The channel region CH of the second active pattern AP2 may vertically overlap with the contact CNT. The second surface SF2 of the second active pattern AP2 may face the contact CNT. A second gate dielectric layer GI2 may be disposed between the second surface SF2 of the second active pattern AP2 and the contact CNT. For example, the second gate dielectric layer GI2 may include a silicon oxide layer, a silicon nitride layer, a silicon oxynitride layer, and/or a high-k dielectric layer. The contact CNT may function as a gate of a transistor including the second active pattern AP2.

For example, the contact CNT and the second active pattern AP2 of the first memory cell MC1 may constitute the second transistor TR2 of the memory cell MC described above with reference to FIG. 1. The second transistor TR2 according to some embodiments may also be a thin film transistor (TFT). Due to the contact CNT, the drain (or source) of the first transistor TR1 may be vertically connected to the gate of the second transistor TR2. The contact CNT may perform a dual function of the drain (or source) of the first transistor TR1 and the gate of the second transistor TR2. The contact CNT may be the storage node SN of FIG. 1.

First upper conductive lines UCL1 may be provided on the first surfaces SF1 of the second active patterns AP2. The first upper conductive lines UCL1 may extend in the second direction D2 in parallel to each other, as best seen in FIG. 2. The first upper conductive lines UCL1 may be arranged in the first direction D1. The first upper conductive line UCL1 may be connected to the first source/drain region SD1 of the second active pattern AP2. The first upper conductive line UCL1 may be the second word line WL2 connected to the drain (or source) of the second transistor TR2 of FIG. 1.

A fourth insulating layer 140 may be provided on the first upper conductive lines UCL1. Second upper conductive lines UCL2 may be provided on the fourth insulating layer 140. The second upper conductive lines UCL2 may extend in the first direction D1 in parallel to each other, as best seen in FIG. 2. The second upper conductive lines UCL2 may be arranged in the second direction D2.

Second vias VI2 may penetrate the fourth insulating layer 140 so as to be connected to the second source/drain regions SD2 of the second active patterns AP2, respectively. The second upper conductive line UCL2 may be disposed on the second via VI2 and may be connected to the second via VI2. The second upper conductive line UCL2 may be electrically connected to the second source/drain region SD2 of the second active pattern AP2 through the second via VI2. The second upper conductive line UCL2 may be the second bit line BL2 connected to the source (or drain) of the second transistor TR2 of FIG. 1. Each of the first upper conductive lines UCL1, the second vias VI2 and the second upper conductive lines UCL2 may include a conductive metal nitride and/or a metal material. Each of the first to fourth insulating layers 110 to 140 may include a silicon oxide layer.

The semiconductor memory device according to some embodiments may realize the memory cell of the 2T1C DRAM device by using a first thin film transistor and a second thin film transistor which are vertically stacked. Since the first thin film transistor and the second thin film transistor partially overlap with each other, an area of the memory cell of the 2T1C DRAM device may be reduced. As a result, an integration density of the semiconductor memory device may be improved.

FIGS. 4, 6, 8, 10, 12, 14, 16, 18 and 20 are plan views illustrating a method of manufacturing a semiconductor memory device according to some embodiments. FIGS. 5, 7, 9, 11, 13, 15, 17, 19 and 21 are cross-sectional views taken along lines A-A' of FIGS. 4, 6, 8, 10, 12, 14, 16, 18 and 20, respectively.

Figure 4:
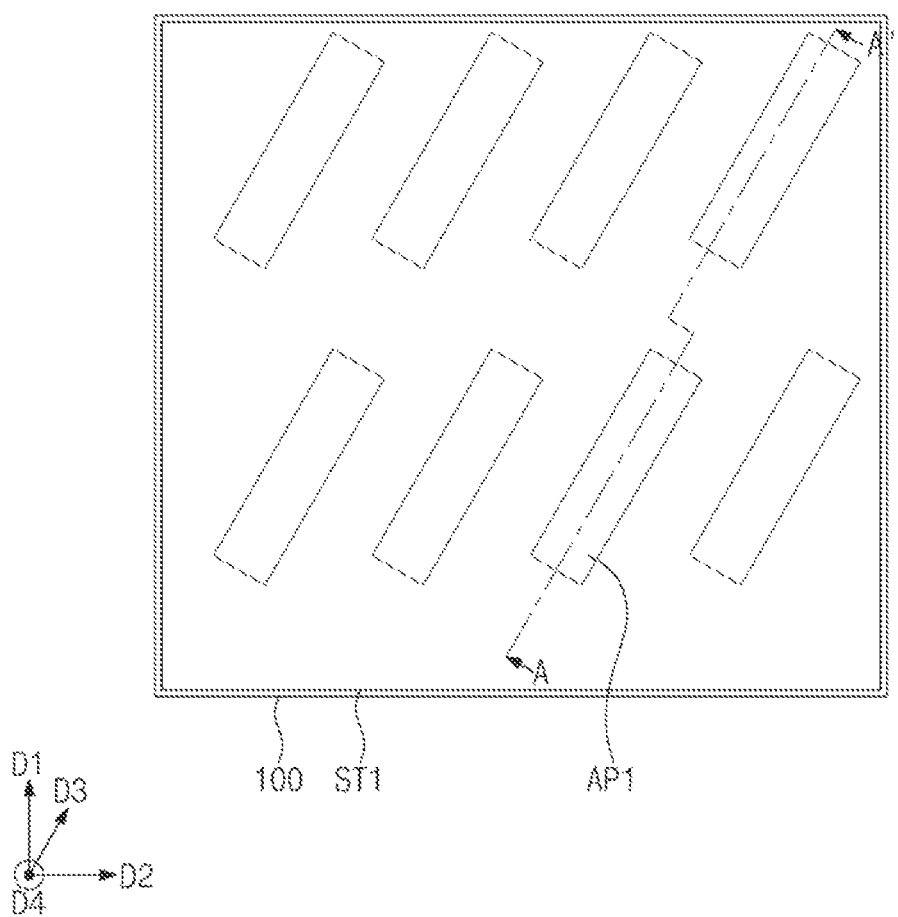
FIGS. 4, 6, 8, 10, 12, 14, 16, 18 and 20 are plan views illustrating a method of manufacturing a semiconductor memory device according to some embodiments.
Figure 5:
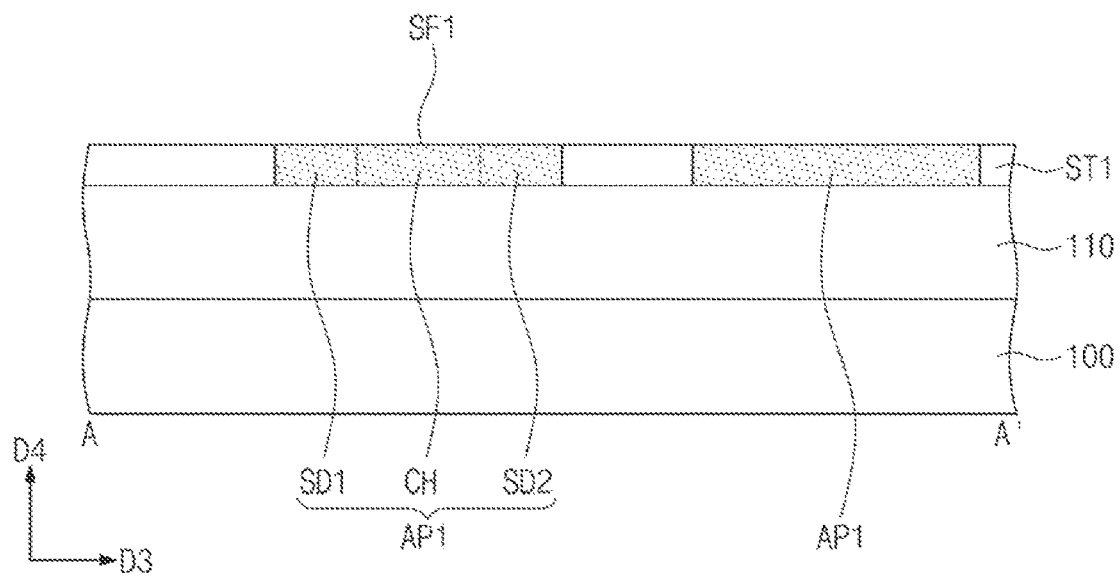
FIGS. 5, 7, 9, 11, 13, 15, 17, 19 and 21 are cross-sectional views taken along lines A-A' of FIGS. 4, 6, 8, 10, 12, 14, 16, 18 and 20, respectively.

Referring to FIGS. 4 and 5, a first insulating layer 110 may be formed on a substrate 100. First active patterns AP1 may be formed on the first insulating layer 110. For example, the formation of the first active patterns AP1 may include forming an amorphous oxide semiconductor layer on the first insulating layer 110, and patterning the amorphous oxide semiconductor layer. Each of the first active patterns AP1 may be formed to extend in the third direction D3. The first active pattern AP1 may include a first source/drain region SD1, a second source/drain region SD2, and a channel region CH between the first and second source/drain regions SD1 and SD2.

A first device isolation layer ST1 filling a space between the first active patterns AP1 may be formed on the first insulating layer 110. The formation of the first device isolation layer ST1 may include forming an insulating layer on the first insulating layer 110 and the first active patterns AP1, and performing a planarization process on the insulating layer until the first surfaces SF1 of the first active patterns AP1 are exposed.

Figure 6:
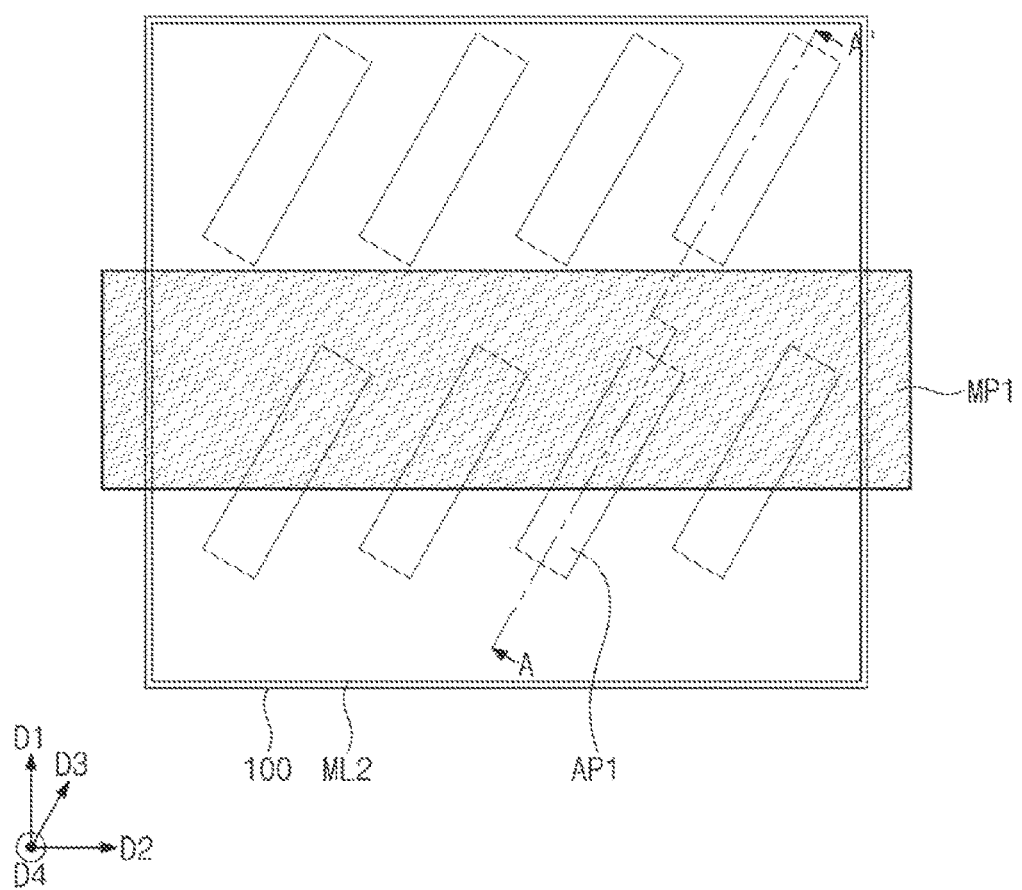
Figure 7:
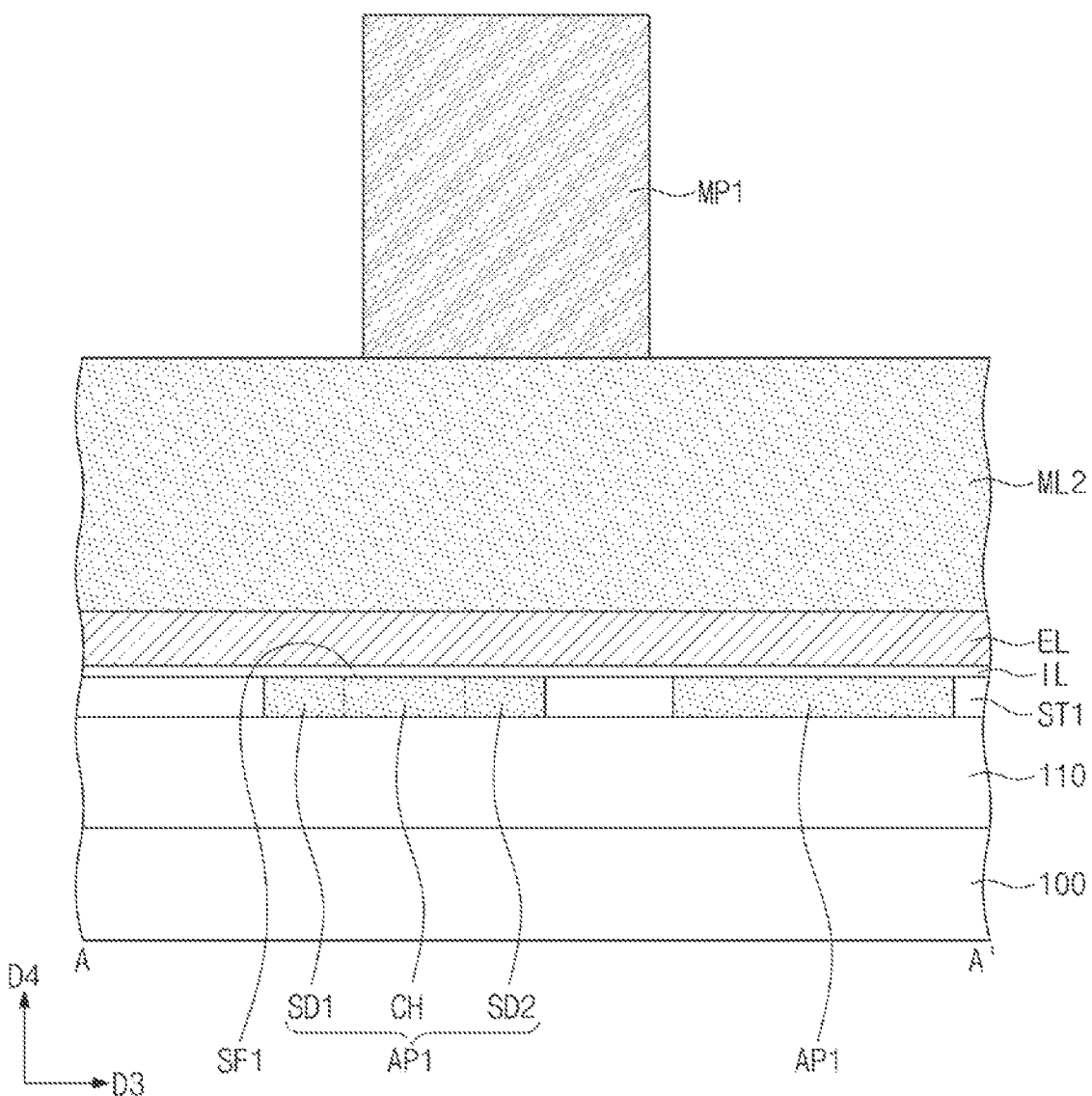

Referring to FIGS. 6 and 7, a dielectric layer IL and an electrode layer EL may be sequentially formed on the first active patterns AP1 and the first device isolation layer ST1. The dielectric layer IL may include a silicon oxide layer, a silicon nitride layer, a silicon oxynitride layer, and/or a high-k dielectric layer, and the electrode layer may include a conductive metal nitride and/or a metal material.

A second mold layer ML2 and a first mold pattern MP1 on the second mold layer ML2 may be formed on the electrode layer EL. The formation of the first mold pattern MP1 may include forming a first mold layer on the second mold layer ML2, and patterning the first mold layer using a photolithography process. The first mold pattern MP1 may have a line shape extending in the second direction D2.

Figure 8:
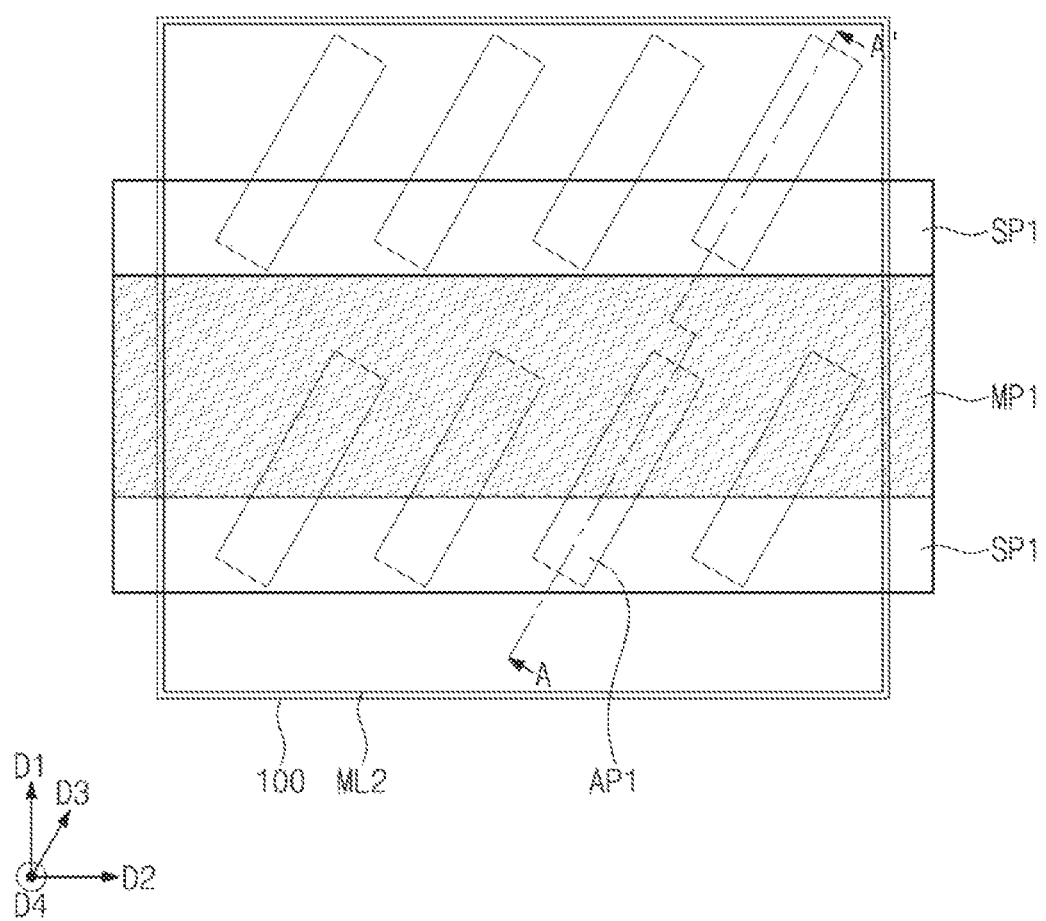
Figure 9:
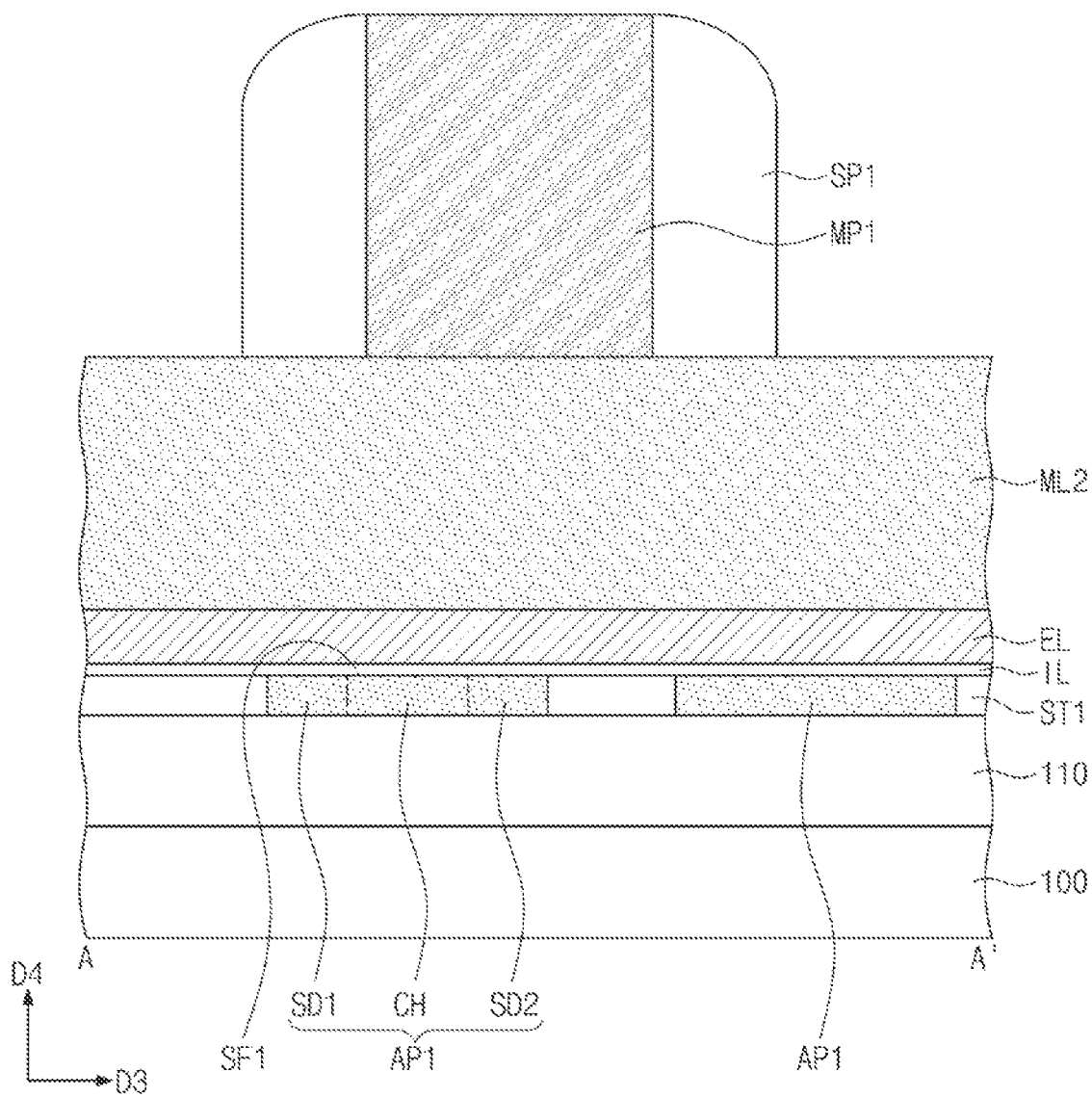

Referring to FIGS. 8 and 9, first spacers SP1 may be formed on both sidewalls of the first mold pattern MP1. The first spacers SP1 may extend in the second direction D2 along the both sidewalls of the first mold pattern MP1. The formation of the first spacers SP1 may include forming a first spacer layer on an entire top surface of the substrate 100, and anisotropically etching the first spacer layer.

Figure 10:
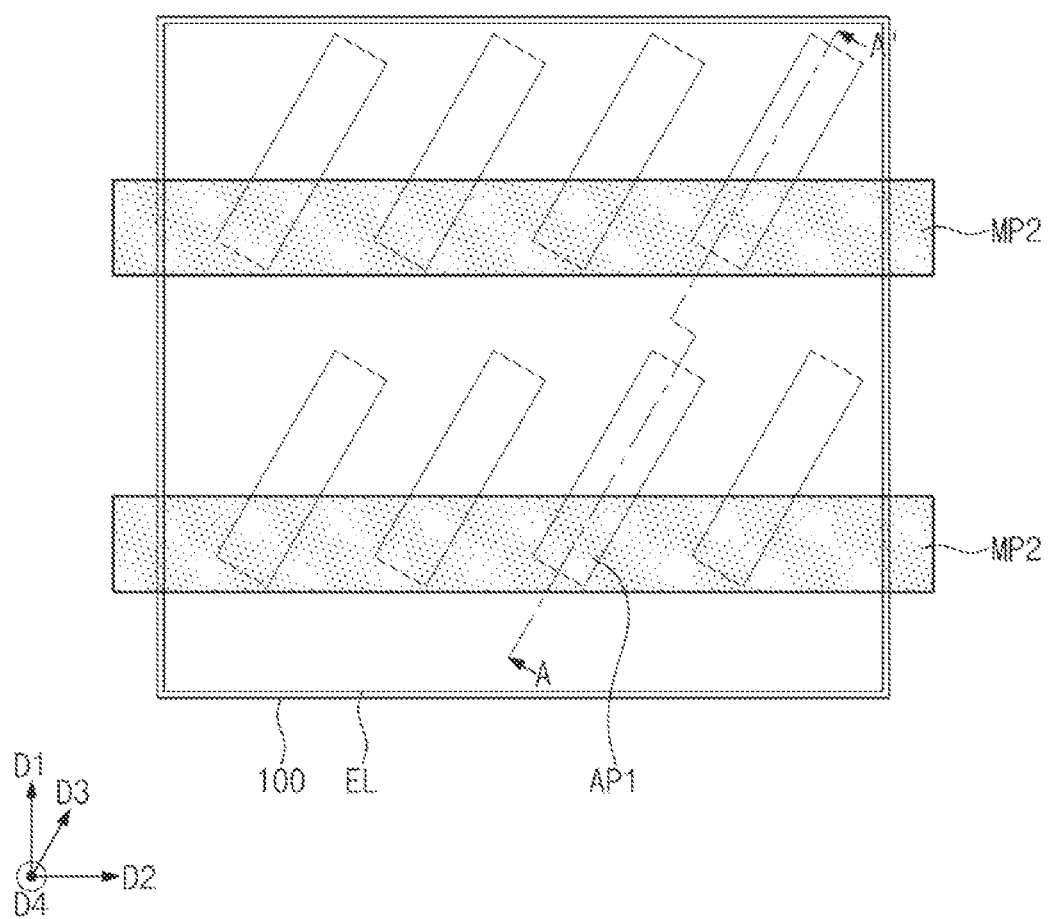
Figure 11:
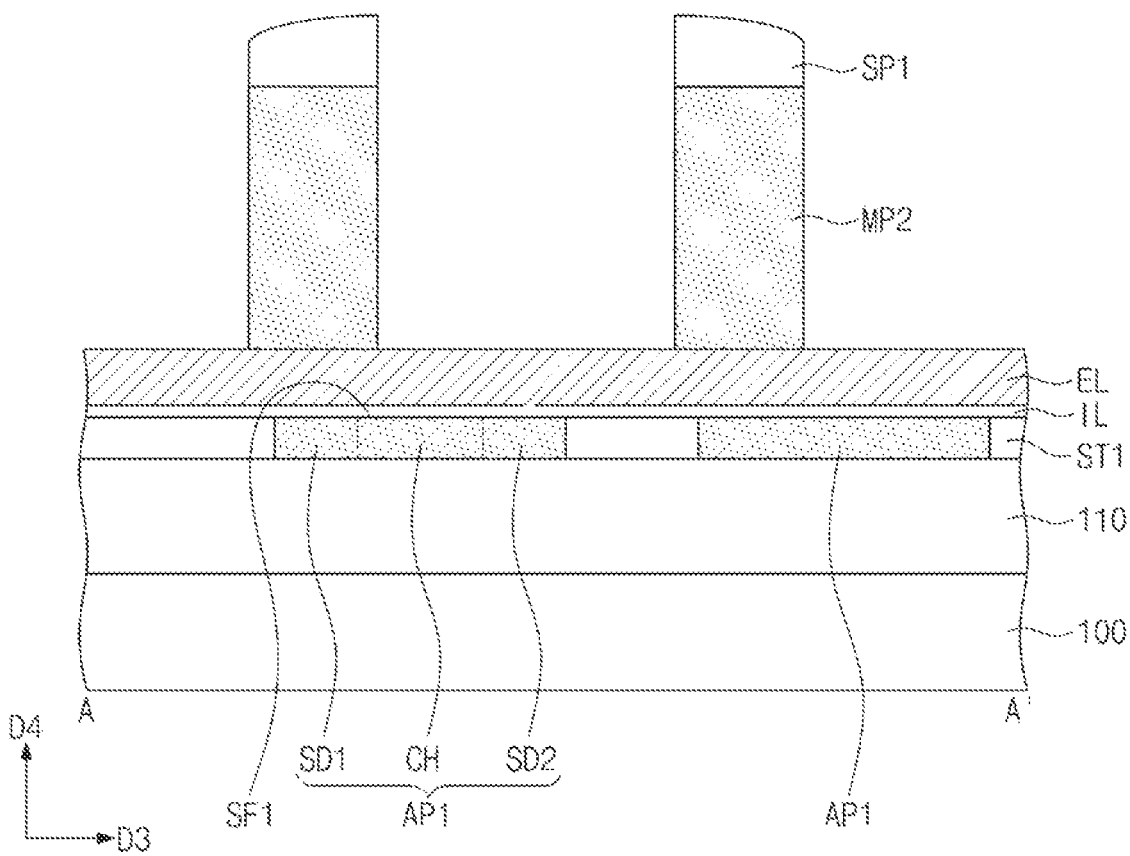

Referring to FIGS. 10 and 11, the first mold pattern MP1 may be selectively removed. The second mold layer ML2 may be patterned using the first spacers SP1 as etch masks to form second mold patterns MP2. Sizes and shapes of the second mold patterns MP2 may be substantially the same as the sizes and shapes of the first spacers SP1.

Figure 12:
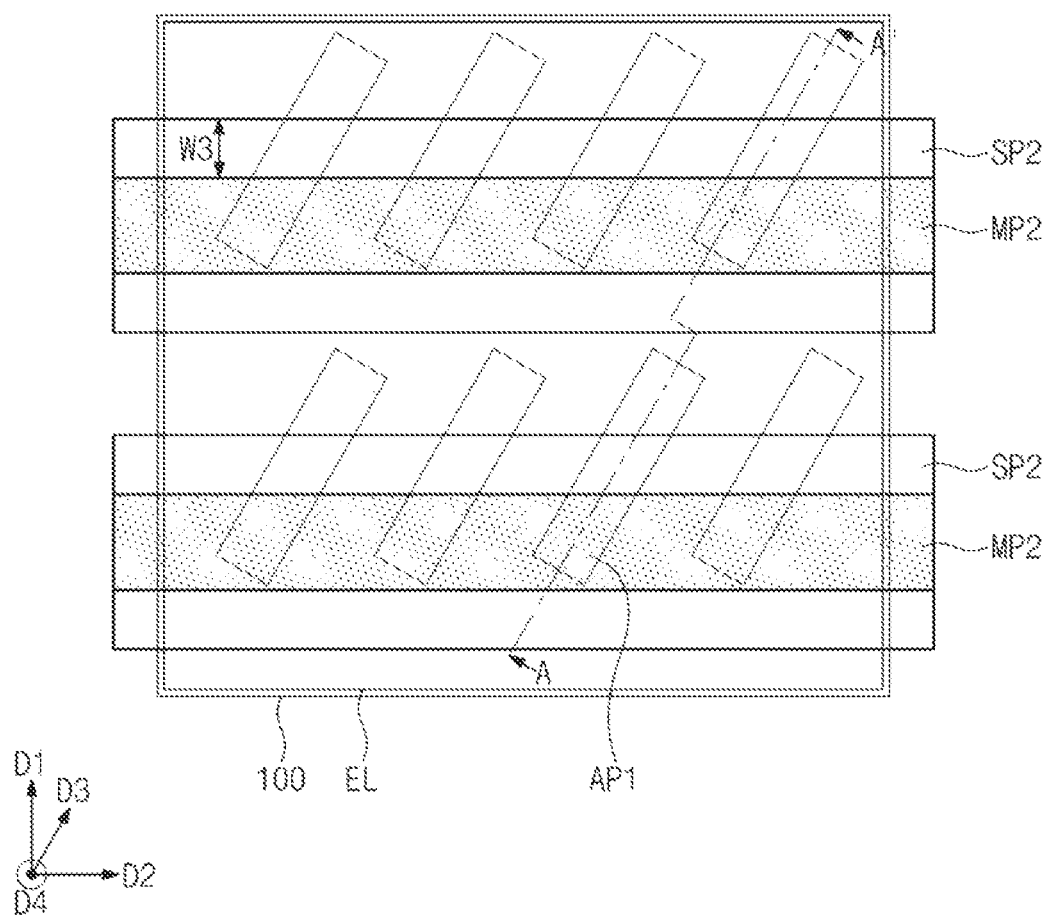
Figure 13:
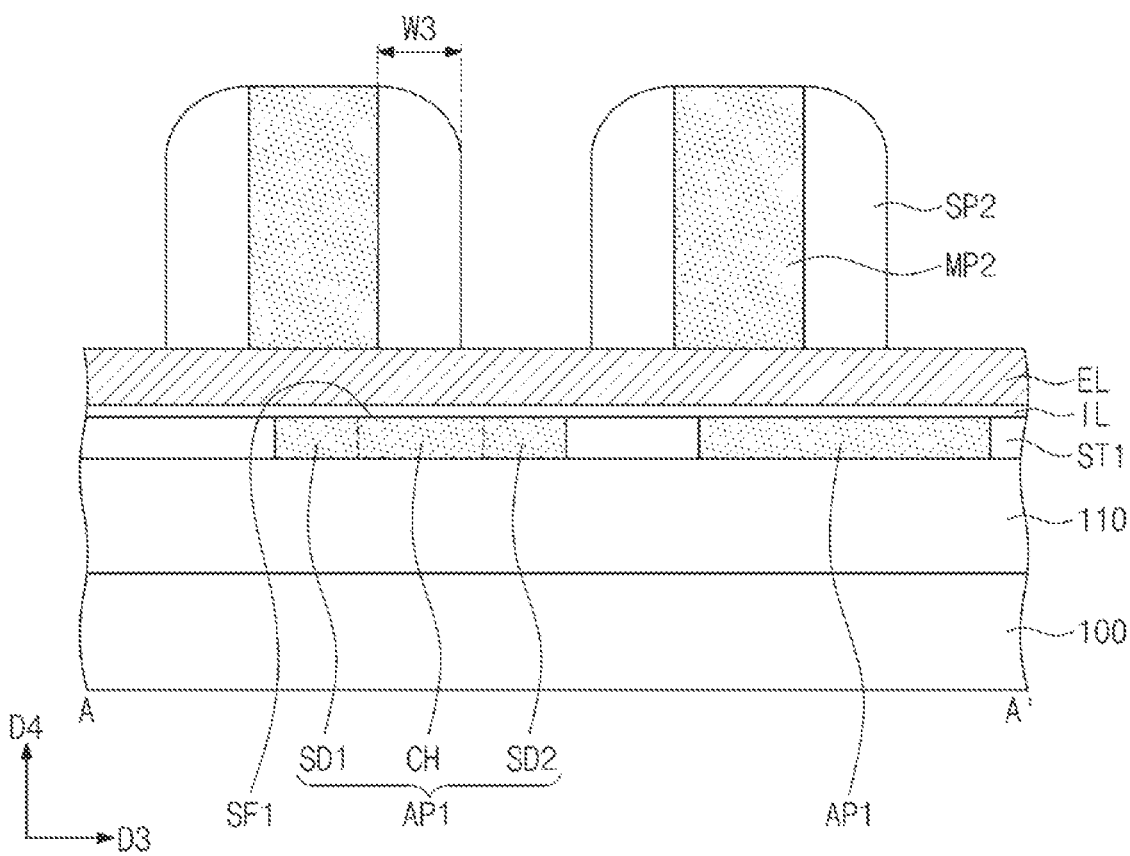

Referring to FIGS. 12 and 13, remaining portions of the first spacers SP1 may be selectively removed. Second spacers SP2 may be formed on both sidewalls of each of the second mold patterns MP2. The second spacers SP2 may extend in the second direction D2 along the both sidewalls of each of the second mold patterns MP2. The formation of the second spacers SP2 may include forming a second spacer layer on an entire top surface of the substrate 100, and anisotropically etching the second spacer layer. The width of the second spacer SP2 may be a third width W3. In some embodiments, the third width W3 may be the maximum width of the second spacer SP2. The second spacer layer may be conformally deposited in such a way that a thickness of the second spacer layer is the third width W3.

Figure 14:
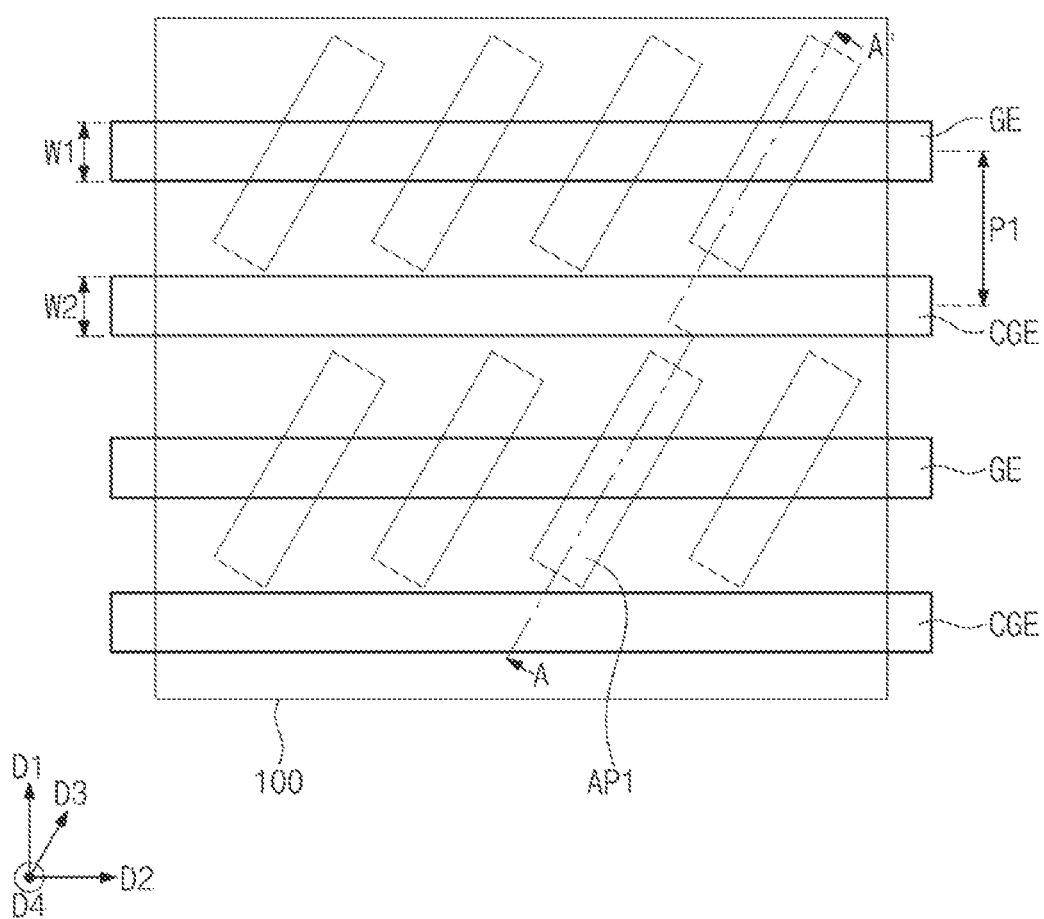
Figure 15:
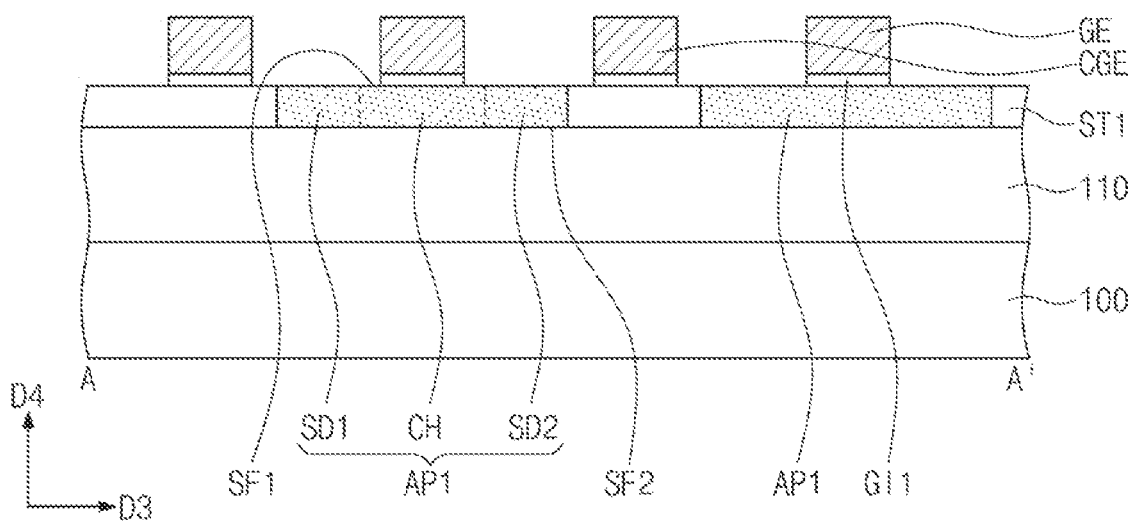

Referring to FIGS. 14 and 15, the second mold patterns MP2 may be selectively removed. The electrode layer EL may be patterned using the second spacers SP2 as etch masks to form gate electrodes GE and capacitor electrodes CGE. The dielectric layer IL may be patterned using the second spacers SP2 as etch masks to form first gate dielectric layers GI1. The gate electrode GE may be formed to intersect the channel region CH of the first active pattern AP1. The first gate dielectric layer GI1 may be disposed between the gate electrode GE and the first surface SF1 of the first active pattern AP1.

The gate electrodes GE and the capacitor electrodes CGE may be alternately arranged in the first direction D1 at a pitch P1. In some embodiments, the pitch P1 may be a constant pitch. The gate electrode GE may have a first width W1 equal to the third width W3 of the second spacer SP2. The capacitor electrode CGE may have a second width W2 equal to the third width W3 of the second spacer SP2.

According to the embodiments described above, four electrodes GE and CGE may be formed using the first mold pattern MP1 as a mandrel. In other words, the four electrodes GE and CGE may be formed from one first mold pattern MP1. However, this is only an example, and the number of electrodes GE and CGE may be less than or more than four.

The capacitor electrodes CGE may be formed together by the process of forming the gate electrodes GE. The capacitor electrode CGE may constitute a capacitor CAP together with a contact CNT and a second insulating layer 120, which will be formed later. An additional process for forming the capacitor may not be required in the manufacturing method according to some embodiments, and thus manufacturing processes may be simplified and an area of the memory cell may be reduced.

Figure 16:
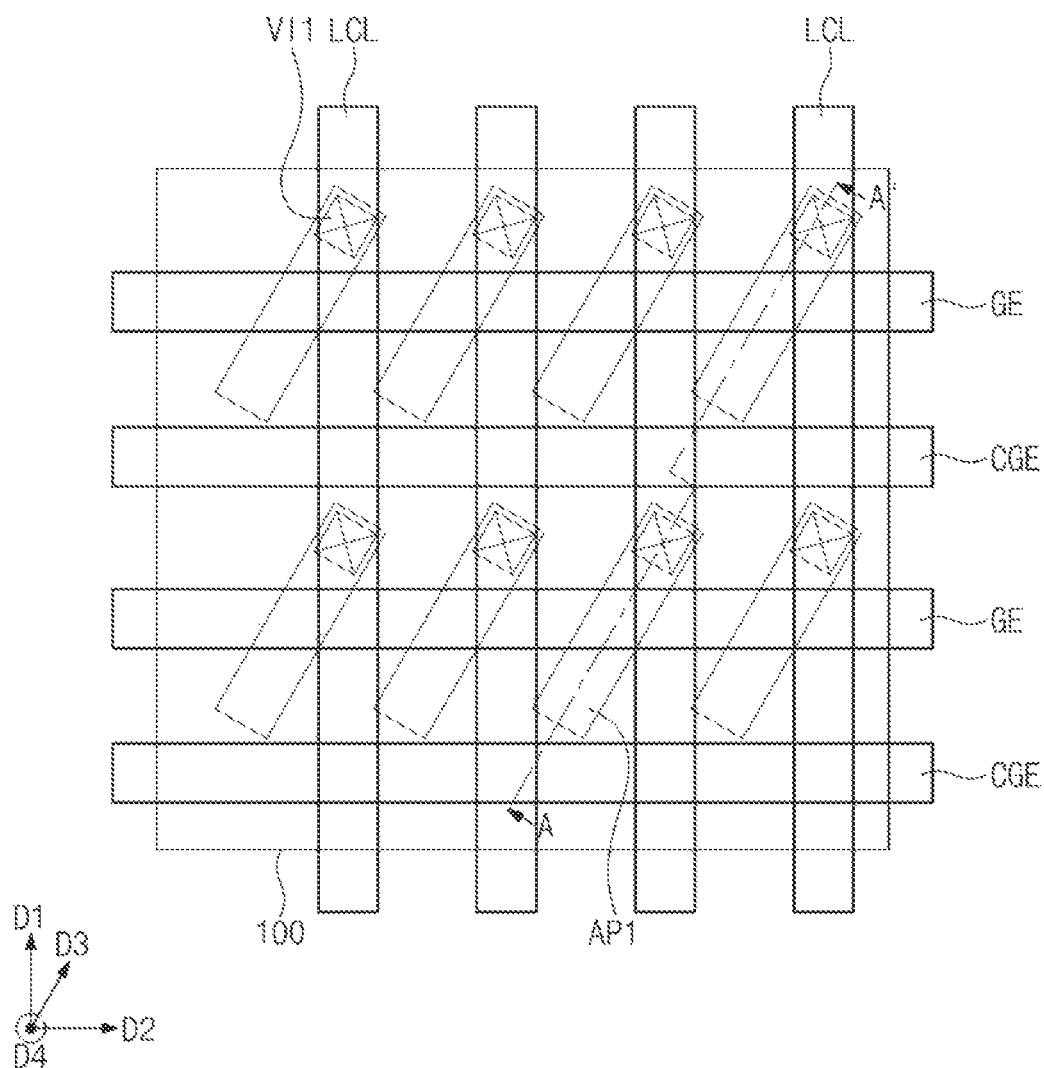
Figure 17:
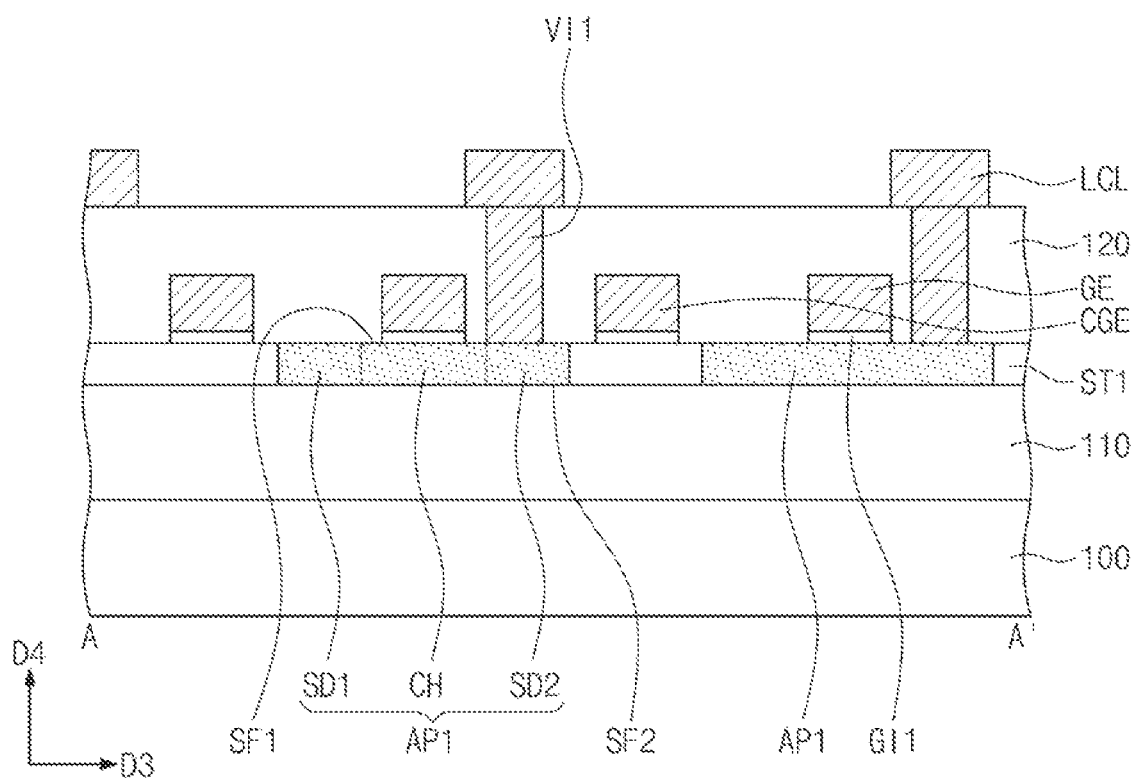

Referring to FIGS. 16 and 17, a second insulating layer 120 may be formed to cover the gate electrodes GE and the capacitor electrodes CGE. First vias VI1 may be formed to penetrate the second insulating layer 120. The first vias VI1 may be connected to the second source/drain regions SD2 of the first active patterns AP1, respectively. For example, the formation of the first vias VI1 may include patterning the second insulating layer 120 to form via holes exposing the second source/drain regions SD2 of the first active patterns AP1, and filling the via holes with a conductive material.

Lower conductive lines LCL may be formed on the second insulating layer 120. The lower conductive lines LCL may extend in the first direction D1 in parallel to each other. The lower conductive lines LCL may be arranged in the second direction D2. The lower conductive line LCL may be connected to the first via VI1. For example, the formation of the lower conductive lines LCL may be performed using a similar method to the method of forming the gate electrodes GE and the capacitor electrodes CGE, described above.

Figure 18:
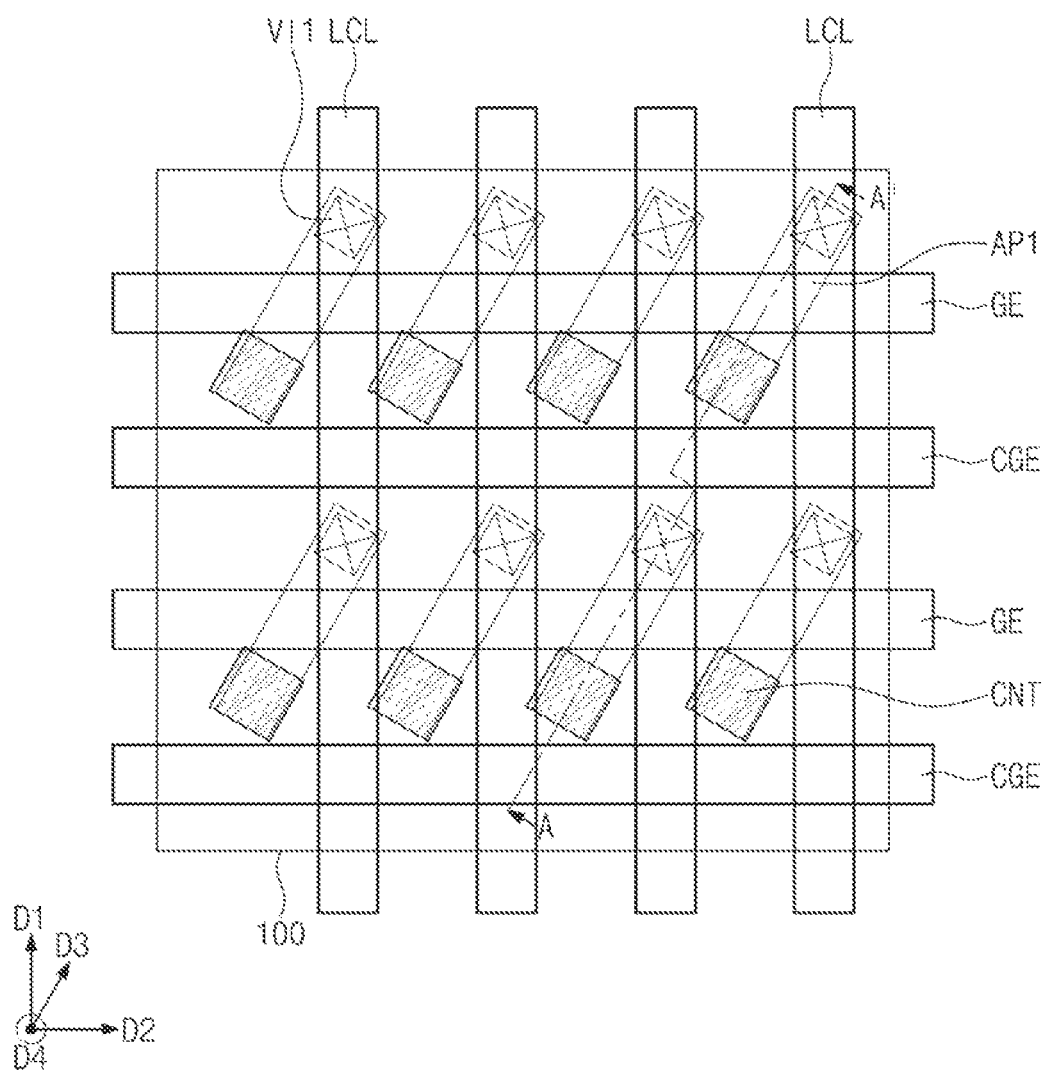
Figure 19:
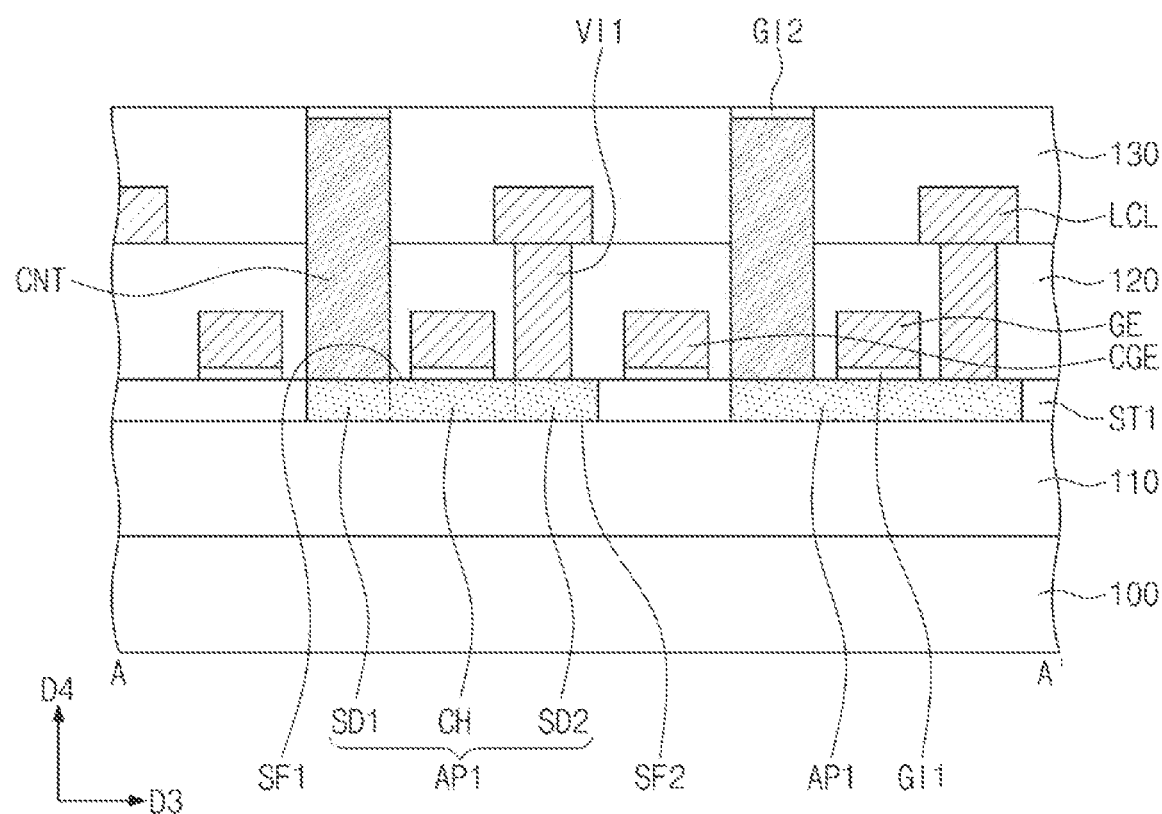

Referring to FIGS. 18 and 19, a third insulating layer 130 may be formed on the second insulating layer 120 to cover the lower conductive lines LCL. Contacts CNT may be formed to penetrate the third and second insulating layers 130 and 120. The contacts CNT may be connected to the first source/drain regions SD1 of the first active patterns AP1, respectively. A second gate dielectric layer GI2 may be formed on each of the contacts CNT.

For example, the formation of the contacts CNT may include patterning the third and second insulating layers 130 and 120 to form contact holes exposing the first source/drain regions SD1 of the first active patterns AP1, and filling the contact holes with a conductive material. The formation of the second gate dielectric layer GI2 may include recessing an upper portion of the contact CNT and filling the recessed region with a dielectric layer.

Figure 20:
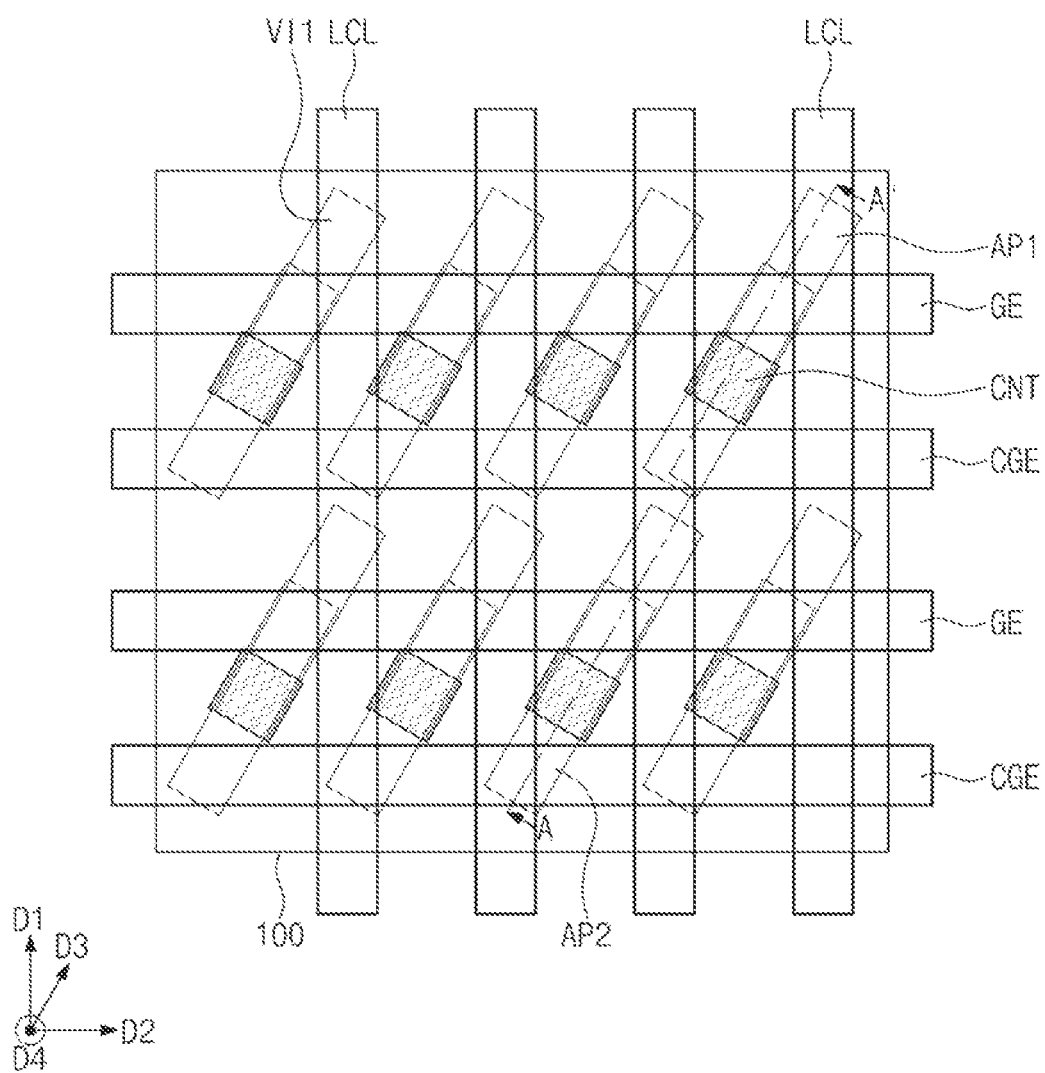
Figure 21:
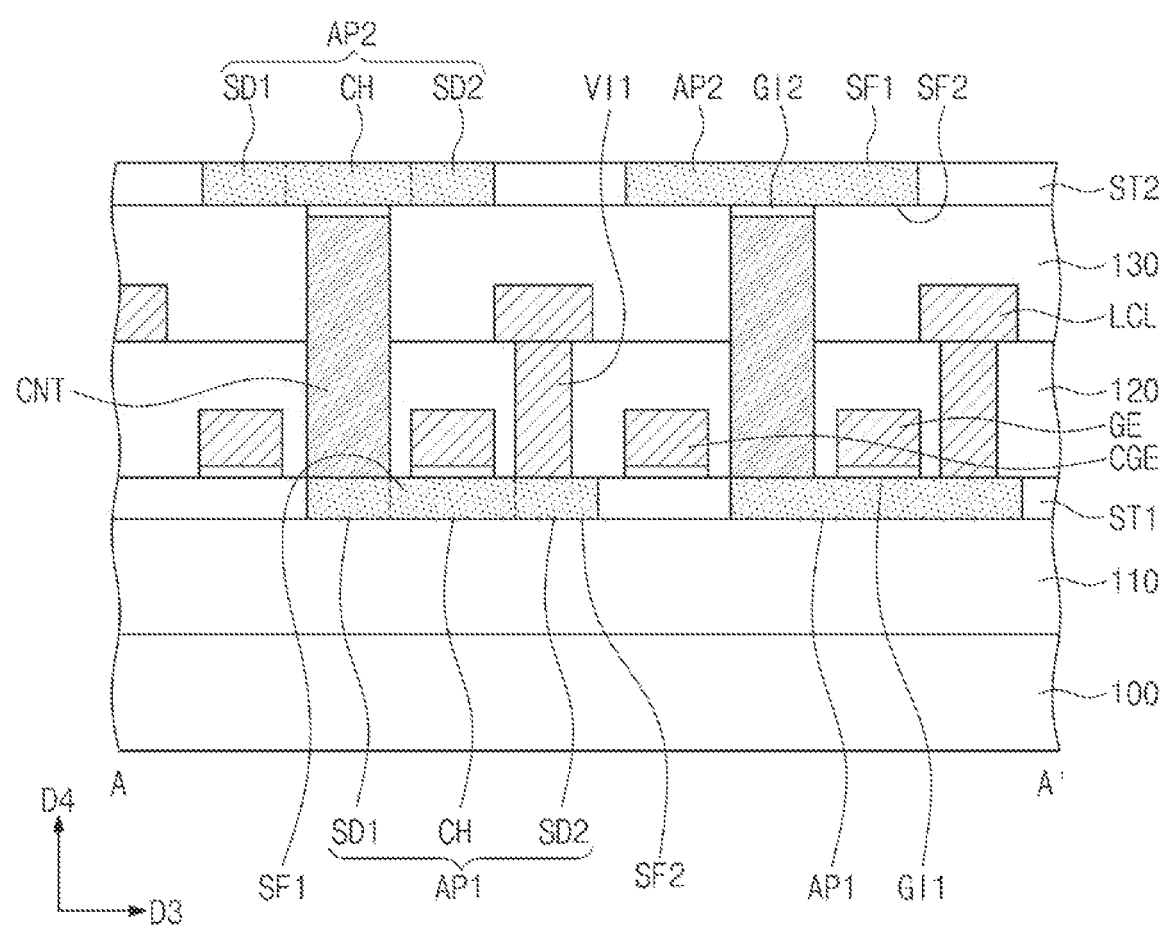

Referring to FIGS. 20 and 21, second active patterns AP2 may be formed on the third insulating layer 130 and the contacts CNT. For example, the formation of the second active patterns AP2 may include forming an amorphous oxide semiconductor layer on the third insulating layer 130, and patterning the amorphous oxide semiconductor layer. Each of the second active patterns AP2 may be formed to extend in the third direction D3. The second active pattern AP2 may include a first source/drain region SD1, a second source/drain region SD2, and a channel region CH between the first and second source/drain regions SD1 and SD2.

The first active pattern AP1 may be offset from the second active pattern AP2 disposed thereon in the third direction D3. Thus, the channel region CH of the second active pattern AP2 may vertically overlap with the contact CNT. The second surface SF2 of the second active pattern AP2 may face the contact CNT.

A second device isolation layer ST2 filling a space between the second active patterns AP2 may be formed on the third insulating layer 130. The formation of the second device isolation layer ST2 may include forming an insulating layer on the third insulating layer 130 and the second active patterns AP2, and performing a planarization process on the insulating layer until the first surfaces SF1 of the second active patterns AP2 are exposed.

Referring again to FIGS. 2 and 3, first upper conductive lines UCL1 may be formed on the second active patterns AP2. The first upper conductive lines UCL1 may extend in the second direction D2 in parallel to each other. The first upper conductive lines UCL1 may be arranged in the first direction D1. The first upper conductive line UCL1 may be connected to the first source/drain region SD1 of the second active pattern AP2.

A fourth insulating layer 140 may be formed to cover the first upper conductive lines UCL1. Second vias VI2 may be formed to penetrate the fourth insulating layer 140. The second vias VI2 may be connected to the second source/drain regions SD2 of the second active patterns AP2, respectively. Second upper conductive lines UCL2 may be formed on the fourth insulating layer 140. The second upper conductive lines UCL2 may extend in the first direction D1 in parallel to each other. The second upper conductive lines UCL2 may be arranged in the second direction D2. The second upper conductive line UCL2 may be connected to the second via VI2.

Figure 22:
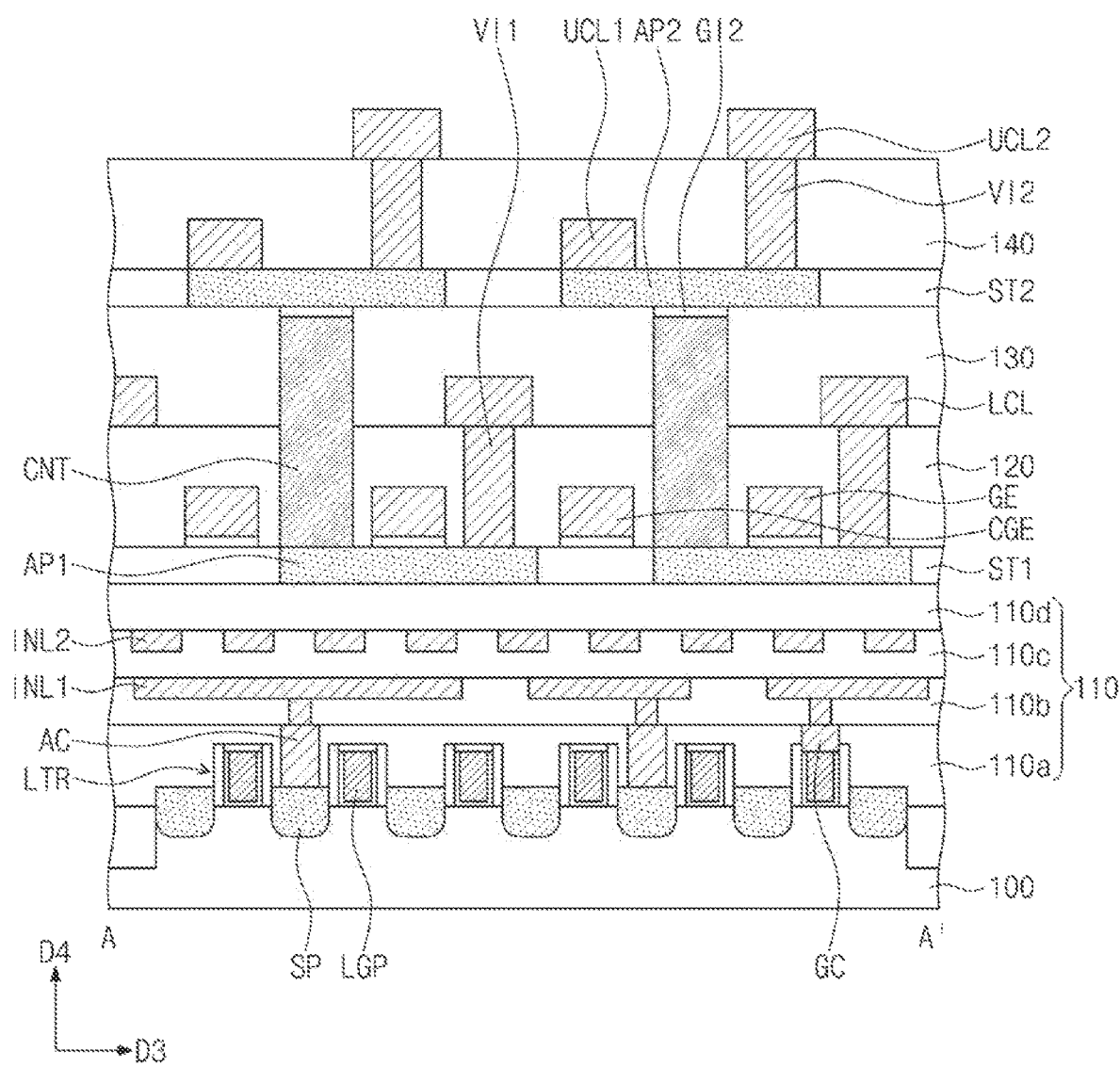
FIG. 22 is a cross-sectional view taken along the line A-A' of FIG. 2 to illustrate a semiconductor memory device according to some embodiments.

FIG. 22 is a cross-sectional view taken along the line A-A' of FIG. 2 to illustrate a semiconductor memory device according to some embodiments. In the embodiment shown in FIG. 22, detailed descriptions to the same technical features as in the above embodiments of FIGS. 1 to 3 will be omitted for the purpose of ease and convenience in explanation. In other words, differences between the embodiment of FIG. 22 and the embodiments of FIGS. 1 to 3 will be mainly described hereinafter.

Referring to FIGS. 2 and 22, logic transistors LTR constituting a logic circuit may be provided on the substrate 100. A first insulating layer 110 may be provided on the substrate 100. The first insulating layer 110 may include first to fourth sub-insulating layers 110a, 110b, 110c and 110d which are sequentially stacked. The first sub-insulating layer 110a may cover the logic transistors LTR.

An active contact AC may penetrate the first sub-insulating layer 110a so as to be connected to a source/drain pattern SP of the logic transistor LTR. A gate contact GC may penetrate the first sub-insulating layer 110a so as to be connected to a gate pattern LGP of the logic transistor LTR.

A first interconnection layer may be provided in the second sub-insulating layer 110b disposed on the first sub-insulating layer 110a. The first interconnection layer may include a plurality of first interconnection lines INL1. At least one of the first interconnection lines INL1 may be electrically connected to the active contact AC. For example the at least one of the first interconnection lines INL1 may be electrically connected to the active contact AC by a through via. At least one of the first interconnection lines INL1 may be electrically connected to the gate contact GC. For example, the least one of the first interconnection lines INL1 may be electrically connected to the gate contact GC by a through via.

A second interconnection layer may be provided in the third sub-insulating layer 110c disposed on the second sub-insulating layer 110b. The second interconnection layer may include a plurality of second interconnection lines INL2. At least one of the second interconnection lines INL2 may be electrically connected to the first interconnection line INL1. The memory cells MC described with reference to FIGS. 1 to 3 may be provided on the fourth sub-insulating layer 110d.

Figure 23:
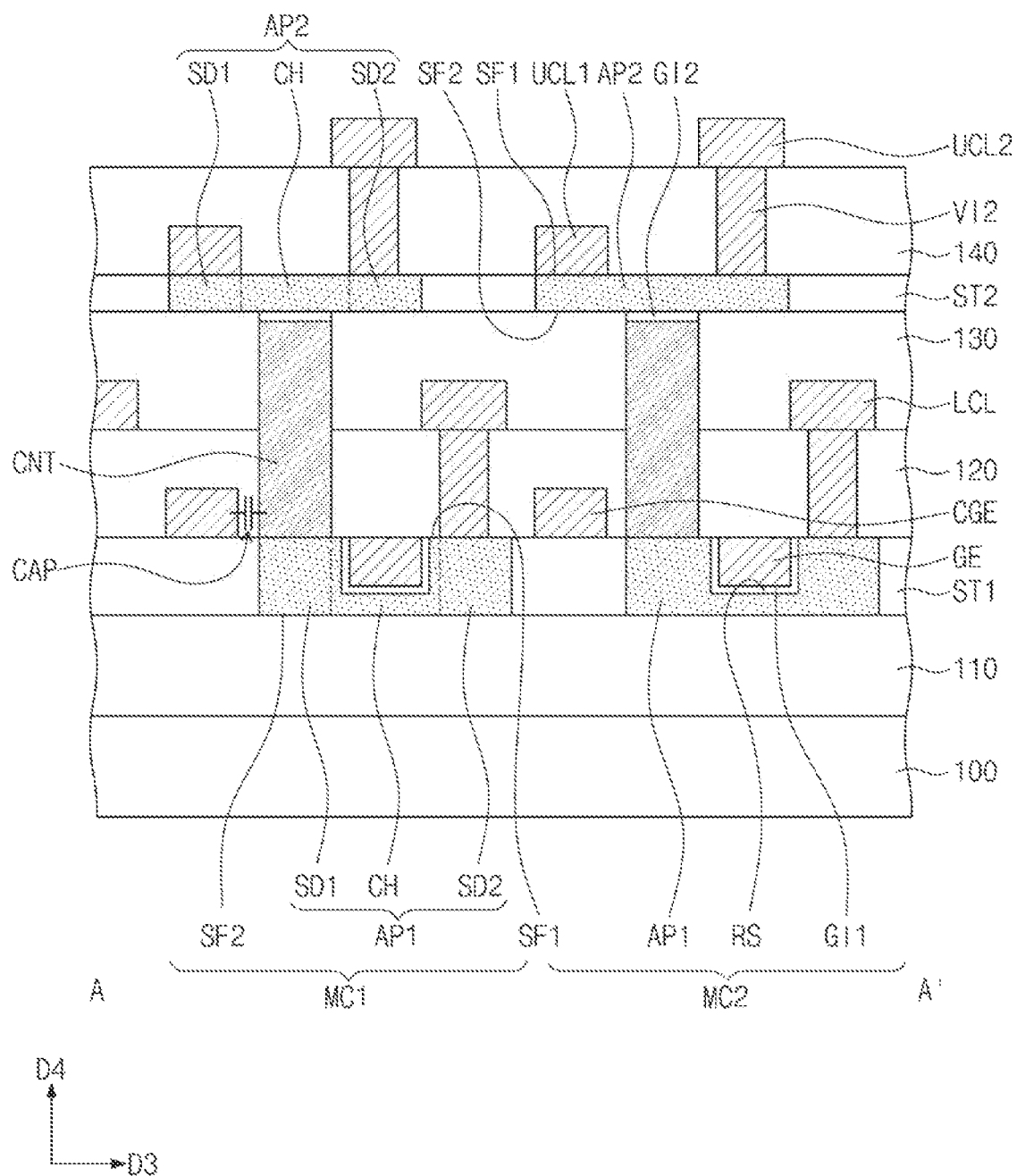
FIG. 23 is a cross-sectional view taken along the line A-A' of FIG. 2 to illustrate a semiconductor memory device according to some embodiments of the inventive concepts.

FIG. 23 is a cross-sectional view taken along the line A-A' of FIG. 2 to illustrate a semiconductor memory device according to some embodiments. In the embodiment shown in FIG. 23, detailed descriptions to the same technical features as in the above embodiments of FIGS. 1 to 3 will be omitted for the purpose of ease and convenience in explanation. In other words, differences between the embodiment of FIG. 23 and the embodiments of FIGS. 1 to 3 will be mainly described hereinafter.

Referring to FIGS. 2 and 23, a recess RS may be defined in the channel region CH of the first active pattern AP1. The recess RS may extend from the first surface SF1 of the first active pattern AP1 toward the second surface SF2 of the first active pattern AP1. A first gate dielectric layer GI1 and a gate electrode GE may sequentially fill the recess RS. In other words, the gate electrode GE may be buried in the first active pattern AP1.

The first gate dielectric layer GI1 may conformally cover an inner surface of the recess RS. The gate electrode GE may be spaced apart from the inner surface of the recess RS with the first gate dielectric layer GI1 interposed therebetween, as shown in FIG. 23. The first gate dielectric layer GI1 may cover sidewalls and a bottom surface of the gate electrode GE.

The capacitor electrodes CGE may be provided on the first device isolation layer ST1. A level of a bottom surface of the capacitor electrode CGE may be the same as or higher than a level of a top surface of the gate electrode GE. The first gate dielectric layer GI1 between the capacitor electrode CGE and the first device isolation layer ST1 may be omitted, as shown in FIG. 23.

The semiconductor memory device according to various embodiments described herein may realize the memory cell of the 2T1C DRAM device by using the first transistor and the second transistor which are vertically stacked. Thus, the area of the memory cell may be reduced, and the integration density of the semiconductor memory device may be improved.

While the inventive concepts have been described with reference to various example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate;
a peripheral circuit layer disposed on the substrate, the peripheral circuit layer includes logic transistors and an interconnection layer that is disposed on the logic transistors;
a first active pattern disposed on the peripheral circuit layer;
a gate electrode disposed on a channel region of the first active pattern;
a first insulating layer disposed on the first active pattern and the gate electrode;
a conductive contact disposed in the first insulating layer and electrically connected to a first source/drain region of the first active pattern; and
a second active pattern disposed on the first insulating layer,
wherein a channel region of the second active pattern vertically overlaps with the conductive contact.

2. The semiconductor device of claim 1, wherein each of the first active pattern and the second active pattern has a first surface, and a second surface which is opposite to the first surface and faces the substrate,
the gate electrode is adjacent to the first surface of the first active pattern, and
the conductive contact is adjacent to the second surface of the second active pattern.

3. The semiconductor device of claim 2, further comprising:
a first gate dielectric layer disposed between the gate electrode and the first surface of the first active pattern; and
a second gate dielectric layer disposed between the conductive contact and the second surface of the second active pattern.

4. The semiconductor device of claim 1, further comprising:
a device isolation layer covering a sidewall of the first active pattern; and
a capacitor electrode on the device isolation layer,
wherein a portion of the first insulating layer is disposed between the capacitor electrode and the conductive contact.

5. The semiconductor device of claim 1, further comprising
a lower conductive line that is electrically connected to a second source/drain region of the first active pattern,
wherein the lower conductive line extends in a first direction, and
the gate electrode extends in a second direction intersecting the first direction.

6. The semiconductor device of claim 5, wherein the first active pattern and the second active pattern extend in a third direction, and
wherein the third direction intersects both the first direction and the second direction.

7. The semiconductor device of claim 1, further comprising:
a first upper conductive line that is electrically connected to a first source/drain region of the second active pattern; and
a second upper conductive line that is electrically connected to a second source/drain region of the second active pattern,
wherein the second upper conductive line extends in a first direction, and
the first upper conductive line extends in a second direction intersecting the first direction.

8. The semiconductor device of claim 1, wherein each of the first active pattern and the second active pattern includes an amorphous oxide semiconductor, and
the amorphous oxide semiconductor contains oxygen (O) and at least two metals selected from a group consisting of zinc (Zn), indium (In), gallium (Ga), and tin (Sn).

9. A semiconductor device comprising:
a substrate;
a first amorphous oxide semiconductor (AOS) layer disposed on the substrate;
a first device isolation layer disposed on a sidewall of the first AOS layer;
a gate electrode disposed on the first AOS layer;
a capacitor electrode disposed on the first device isolation layer;
an insulating layer disposed on the first AOS layer, the gate electrode, and the capacitor electrode;
a contact disposed in the insulating layer and electrically connected to the first AOS layer; and
a second amorphous oxide semiconductor (AOS) layer disposed on the contact,
wherein the contact is disposed between the gate electrode and the capacitor electrode.

10. The semiconductor device of claim 9, further comprising:
a first gate dielectric layer that is disposed between the gate electrode and the first AOS layer; and
a second gate dielectric layer that is disposed between the contact and the second AOS layer.

11. The semiconductor device of claim 9, further comprising
a lower conductive line that is electrically connected to the first AOS layer,
wherein the contact is connected to a first source/drain region of the first AOS layer, the lower conductive line is connected to a second source/drain region of the first AOS layer,
the lower conductive line extends in a first direction, and
the gate electrode extends in a second direction intersecting the first direction.

12. The semiconductor device of claim 11, wherein the first AOS layer and the second AOS layer extend in a third direction, and
the third direction intersects both the first direction and the second direction.

13. The semiconductor device of claim 9, wherein each of the first and second AOS layers contains oxygen (O) and at least two metals selected from a group consisting of zinc (Zn), indium (In), gallium (Ga), and tin (Sn).

14. The semiconductor device of claim 9, further comprising a second device isolation layer that is disposed on a sidewall of the second AOS layer.

15. The semiconductor device of claim 14, wherein the first AOS layer and the first device isolation layer are located at a first level, and
the second AOS layer and the second device isolation layer are located at a second level higher than the first level.

16. A semiconductor device comprising:
a substrate;
a first insulating layer disposed on the substrate and including a logic transistor and an interconnection layer;
a first active pattern disposed on the first insulating layer and including an amorphous oxide semiconductor, the first active pattern includes a first source/drain region, a second source/drain region, and a first channel region that is disposed between the first source/drain region and the second source/drain region;
a first gate electrode disposed on the first channel region of the first active pattern;
a second insulating layer disposed on the first active pattern and the first gate electrode;
a second gate electrode disposed in the second insulating layer and including a first end portion and a second end portion that is disposed opposite to the first end portion;
a first bit line electrically connected to the first source/drain region of the first active pattern;
a second active pattern disposed on the second insulating layer and including an amorphous oxide semiconductor, the second active pattern includes a third source/drain region, a fourth source/drain region, and a second channel region that is disposed between the third source/drain region and the fourth source/drain region; and
a second bit line electrically connected to the third source/drain region of the second active pattern,
wherein the first end portion of the second gate electrode is electrically connected to the second source/drain region of the first active pattern, and
the second end portion of the second gate electrode is disposed on the second channel region of the second active pattern.

17. The semiconductor device of claim 16, further comprising:
a first gate dielectric layer that is disposed between the first channel region of the first active pattern and the first gate electrode; and
a second gate dielectric layer that is disposed between the second channel region of the second active pattern and the second end portion of the second gate electrode.

18. The semiconductor device of claim 16, further comprising:
a first word line electrically connected to the first gate electrode; and
a second word line electrically connected to the fourth source/drain region of the second active pattern.

19. The semiconductor device of claim 16, wherein each of the first active pattern and the second active pattern includes indium gallium zinc oxide (IGZO) or indium tin zinc oxide (ITZO).

20. The semiconductor device of claim 16, further comprising a capacitor electrode that is disposed adjacent to the second gate electrode.

* * * * *